(12) United States Patent
Marenco

(10) Patent No.: US 8,900,904 B2
(45) Date of Patent: Dec. 2, 2014

(54) METHOD OF MANUFACTURING A MULTITUDE OF MICRO-OPTOELECTRONIC DEVICES, AND MICRO-OPTOELECTRONIC DEVICE

(75) Inventor: Norman Marenco, Bokelrehm (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 13/231,732

(22) Filed: Sep. 13, 2011

(65) Prior Publication Data
US 2012/0091551 A1    Apr. 19, 2012

Related U.S. Application Data

(63) Continuation of application No. PCT/EP2010/052923, filed on Mar. 8, 2010.

(30) Foreign Application Priority Data

Mar. 13, 2009  (DE) .......................... 10 2009 013 112

(51) Int. Cl.
| | | |
|---|---|---|
| H01L 21/00 | (2006.01) | |
| H01L 27/146 | (2006.01) | |
| H01L 31/0232 | (2014.01) | |
| H01L 31/0203 | (2014.01) | |

(52) U.S. Cl.
CPC .... *H01L 27/14685* (2013.01); *H01L 27/14625* (2013.01); *H01L 27/14618* (2013.01); *H01L 27/14689* (2013.01); *H01L 31/0203* (2013.01); *H01L 31/0232* (2013.01)
USPC .............................................. 438/48; 257/432

(58) Field of Classification Search
CPC ................... H01L 27/14685; H01L 27/14625; H01L 31/0232; H01L 31/0203; H01L 27/14689; H01L 27/14618
USPC .............................................. 257/432; 438/48
See application file for complete search history.

(56) References Cited

U.S. PATENT DOCUMENTS

| | | | |
|---|---|---|---|
| 4,524,127 A | 6/1985 | Kane et al. | |
| 5,227,313 A | 7/1993 | Gluck et al. | |
| 6,057,538 A | 5/2000 | Clarke | |
| 2002/0163054 A1 | 11/2002 | Suda | |
| 2003/0010425 A1 | 1/2003 | Lee et al. | |

(Continued)

FOREIGN PATENT DOCUMENTS

| | | |
|---|---|---|
| EP | 0840502 A2 | 5/1998 |
| EP | 1215729 A2 | 6/2002 |

(Continued)

*Primary Examiner* — Douglas Menz
(74) *Attorney, Agent, or Firm* — Michael A. Glenn; Perkins Coie LLP

(57) ABSTRACT

A wafer stack that is diced to produce a multitude of micro-optoelectronic devices includes a first wafer including a semiconductor material; a second wafer including an optically transparent material; a multitude of light sensor arrangements in the semiconductor material of the first wafer for each of the micro-optical devices; the second wafer structured to form a multitude of micro-optical elements therein for each of the micro-optoelectronic devices; and a wafer stack produced wafer bonding, the wafer stack including the first wafer and the second wafer arranged above same, each of the micro-optical elements arranged and structured such that different portions of light incident on the micro-optical element are directed onto different light sensor elements of a light sensor arrangement at least partly arranged below the micro-optical element.

13 Claims, 16 Drawing Sheets

(56) References Cited

U.S. PATENT DOCUMENTS

| | | |
|---|---|---|
| 2006/0043262 A1 | 3/2006 | Akram |
| 2007/0034777 A1 | 2/2007 | Tuckerman et al. |
| 2007/0052050 A1 | 3/2007 | Dierickx |
| 2007/0117253 A1 | 5/2007 | Hsu et al. |
| 2007/0259463 A1 | 11/2007 | Abedini |
| 2007/0262364 A1 | 11/2007 | Hsu et al. |
| 2008/0122055 A1 | 5/2008 | Perkins |
| 2008/0290435 A1 | 11/2008 | Oliver et al. |
| 2009/0140131 A1 | 6/2009 | Utagawa |

FOREIGN PATENT DOCUMENTS

| | | |
|---|---|---|
| JP | 03-91960 | 4/1991 |
| JP | 07-202149 | 4/1995 |
| JP | 10-070713 | 3/1998 |
| JP | 2000-507048 | 6/2000 |
| JP | 2001-094089 | 4/2001 |
| JP | 2007-004471 | 1/2007 |
| JP | 2008-036058 | 2/2008 |
| WO | 2008/006504 A2 | 1/2008 |

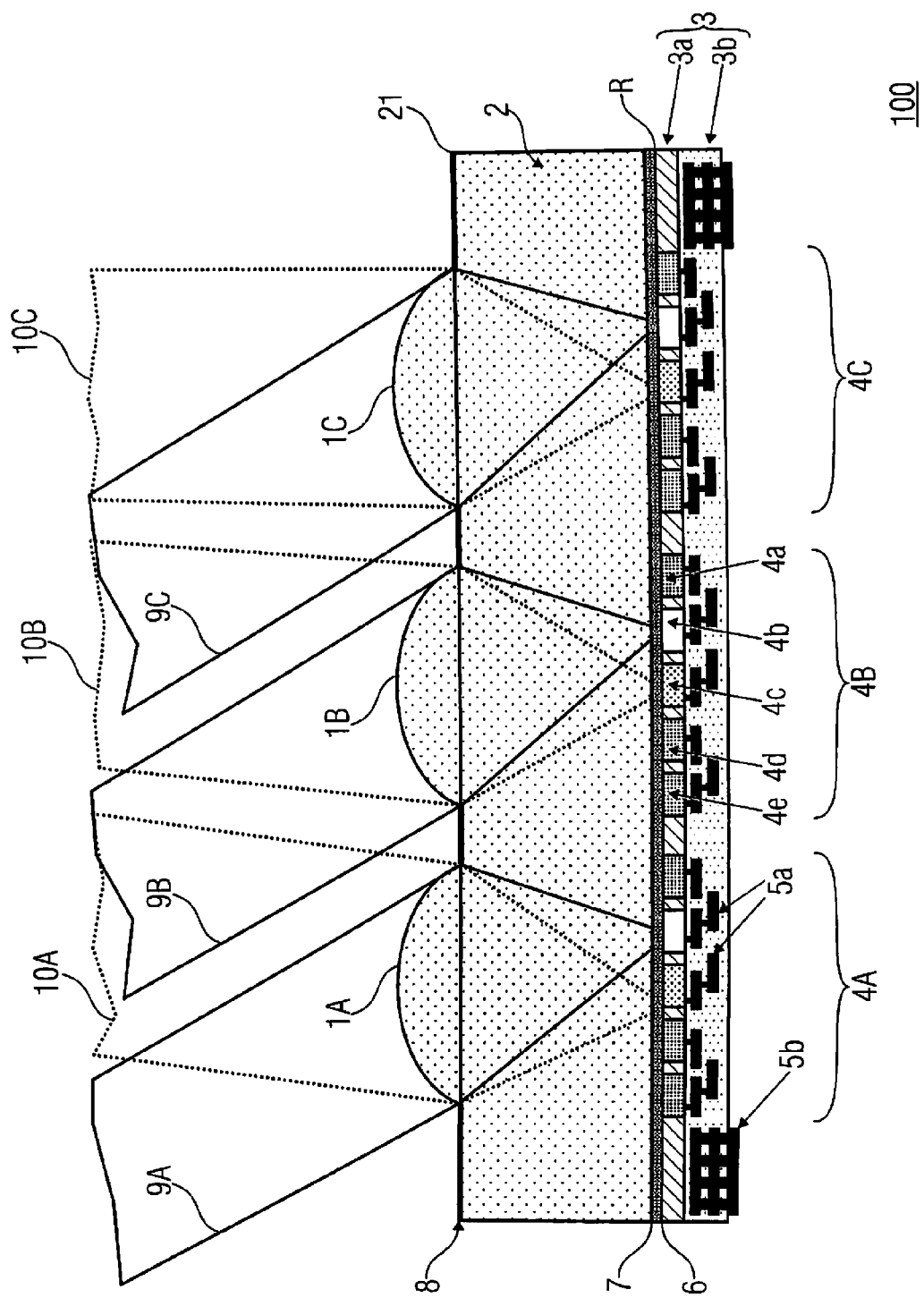

| f | BZ | n | R | r | h | | R/f= | r/f= | h/f= |
|---|---|---|---|---|---|---|---|---|---|
| 600 | 4 | 1,47 | 192 | 75 | 15,3 | | 32,0% | 12,5% | 2,5% |
| 500 | 4 | 1,47 | 160 | 63 | 12,7 | | 32,0% | 12,5% | 2,5% |
| 400 | 4 | 1,47 | 128 | 50 | 10,2 | | 32,0% | 12,5% | 2,5% |
| 300 | 4 | 1,47 | 96 | 38 | 7,6 | | 32,0% | 12,5% | 2,5% |
| 200 | 4 | 1,47 | 64 | 25 | 5,1 | | 32,0% | 12,5% | 2,5% |
| 100 | 4 | 1,47 | 32 | 13 | 2,5 | | 32,0% | 12,5% | 2,5% |
| 50 | 4 | 1,47 | 16 | 6 | 1,3 | | 32,0% | 12,5% | 2,5% |
| 30 | 4 | 1,47 | 10 | 4 | 0,8 | | 32,0% | 12,5% | 2,5% |

FIGURE 8B

| f | BZ | n | R | r | h | | R/f= | r/f= | h/f= |
|---|---|---|---|---|---|---|---|---|---|
| 600 | 2,8 | 1,47 | 192 | 107 | 32,7 | | 32,0% | 17,9% | 5,5% |
| 600 | 4,0 | 1,47 | 192 | 75 | 15,3 | | 32,0% | 12,5% | 2,5% |
| 600 | 5,6 | 1,47 | 192 | 54 | 7,6 | | 32,0% | 8,9% | 1,3% |
| 600 | 8,0 | 1,47 | 192 | 38 | 3,7 | | 32,0% | 6,3% | 0,6% |
| 600 | 11,0 | 1,47 | 192 | 27 | 1,9 | | 32,0% | 4,5% | 0,3% |
| 600 | 16,0 | 1,47 | 192 | 19 | 0,9 | | 32,0% | 3,1% | 0,2% |
| 600 | 22,0 | 1,47 | 192 | 14 | 0,5 | | 32,0% | 2,3% | 0,1% |
| 600 | 32,0 | 1,47 | 192 | 9 | 0,2 | | 32,0% | 1,6% | 0,0% |

FIGURE 8C

| f | BZ | n | R | r | h | | R/f= | r/f= | h/f= |
|---|---|---|---|---|---|---|---|---|---|
| 600 | 4 | 1,45 | 186 | 75 | 15,8 | | 31,0% | 12,5% | 2,6% |
| 600 | 4 | 1,50 | 200 | 75 | 14,6 | | 33,3% | 12,5% | 2,4% |
| 600 | 4 | 1,55 | 213 | 75 | 13,6 | | 35,5% | 12,5% | 2,3% |
| 600 | 4 | 1,60 | 225 | 75 | 12,9 | | 37,5% | 12,5% | 2,1% |
| 600 | 4 | 1,65 | 236 | 75 | 12,2 | | 39,4% | 12,5% | 2,0% |
| 600 | 4 | 1,70 | 247 | 75 | 11,7 | | 41,2% | 12,5% | 1,9% |
| 600 | 4 | 1,75 | 257 | 75 | 11,2 | | 42,9% | 12,5% | 1,9% |
| 600 | 4 | 1,80 | 267 | 75 | 10,8 | | 44,4% | 12,5% | 1,8% |

FIGURE 8D

METHOD OF MANUFACTURING A MULTITUDE OF MICRO-OPTOELECTRONIC DEVICES, AND MICRO-OPTOELECTRONIC DEVICE

CROSS-REFERENCE TO RELATED APPLICATIONS

This application is a continuation of copending International Application No. PCT/EP2010/052923, filed Mar. 8, 2010, which is incorporated herein by reference in its entirety, and additionally claims priority from German Patent Application No. 102009013112.4, filed Mar. 13, 2009, which is also incorporated herein by reference in its entirety.

The invention relates to integrating micro-optical elements and microelectronic image sensors.

BACKGROUND OF THE INVENTION

There is a general tendency to miniaturize the optics and electronics of image-sensing apparatuses with regard to their surface areas, or two-dimensional extensions, and with regard to their thicknesses and/or their overall heights, which result from the thicknesses of the optical elements and the thicknesses of the sensor elements and from the distance between the optical element and the respective image sensor. As the level of miniaturization increases, requirements placed upon adjustment of the optical elements relative to the corresponding sensor elements with regard to their mutual distances and mutual rotations increase as well.

At the same time, it is desirable to be able to employ optical elements having most varied optical properties also in such miniaturized optoelectronic systems so as to be able to realize—in addition to classic photography—light-field photography or spectral decomposition of light, for example.

Previous structural design technologies, in particular for light-field photography, have been based on discrete components wherein each image sensor is individually provided with the optical element specified for it. Adjustment is effected via precision-mechanical adjustment apparatuses, with which height adjustment (z direction) and the lateral position (x-y direction) may be set permanently or reversibly. However, the level of accuracy of the adjustment here is limited, e.g. is in a range of above 20 µm.

A different approach to adjustment and fixing consists in utilizing shrinkage of a UV-curing (UV=ultraviolet) adhesive for highly precise repositioning. Said adhesive is employed, for example, for adjusting glass fibers in front of laser diodes. Adjustment is achieved in that UV irradiation is adapted such that the glass fiber is fixed in place in as ideal a position as possible in relation to the laser diode.

Another possibility consists in employing microactuators as a dynamic positioning apparatuses so as to optimally position the optical element in relation to the sensor element.

SUMMARY

According to one embodiment, a method of manufacturing a multitude of micro-optoelectronic devices for light-field photography, may have the steps of: providing a first wafer having a semiconductor material; providing a second wafer having an optically transparent material; producing a multitude of light sensor arrangements in the semiconductor material of the first wafer for each of the micro-optical devices to be manufactured; structuring the second wafer such that a multitude of micro-optical lenses are formed therein for each of the micro-optoelectronic devices to be manufactured; producing a wafer stack by means of wafer bonding, said wafer stack having the first wafer and the second wafer arranged above same, each of the micro-optical lenses being arranged and optically structured such that light beams directed from a point of an object onto the micro-optical lens by a main lens at different angles of incidence are directed onto different light sensor elements of a light sensor arrangement at least partly arranged below said micro-optical lens; and dicing the wafer stack into the multitude of micro-optoelectronic devices.

According to another embodiment, a method of manufacturing a multitude of micro-optoelectronic devices may have the steps of: providing a wafer having a semiconductor material; producing a multitude of light sensor arrangements in the semiconductor material of the first wafer on a first side of same for each of the micro-optical devices to be manufactured; and structuring the wafer on a side which is opposite the first side of the wafer, by means of a rear-side etch attack, lithographic structuring or local material changes such that a multitude of micro-optical elements are formed therein for each of the micro-optoelectronic devices to be manufactured, each of the micro-optical elements being arranged and optically structured such that different portions of the light incident on the micro-optical element are directed onto different light sensor elements of a light sensor arrangement at least partly arranged below said micro-optical element.

According to another embodiment, a method of manufacturing a multitude of micro-optoelectronic devices for light-field photography may have the steps of: providing a wafer having a semiconductor material; producing a multitude of light sensor arrangements in the semiconductor material of the wafer on a first side of same for each of the micro-optical devices to be manufactured; applying a multitude of micro-optical lenses on a side which is opposite the first side of the wafer, such that a multitude of micro-optical lenses are formed for each of the micro-optoelectronic devices to be manufactured, each of the micro-optical lenses being arranged and optically structured such that light beams directed from a point of an object onto the micro-optical lens by a main lens at different angles of incidence are directed onto different light sensor elements of a light sensor arrangement at least partly arranged below said micro-optical lens; and dicing the wafer into the multitude of micro-optoelectronic devices.

According to another embodiment, a micro-optoelectronic device for light-field photography, may have: a stack consisting of a first wafer section and a second wafer section arranged above same, the first wafer section having a semiconductor material which includes a multitude of light sensor arrangements formed therein, and each of the multitude of light sensor arrangements having a multitude of light sensor elements, and the second wafer section having an optically transparent material and being structured such that a multitude of micro-optical lenses are formed therein, each of the multitude of micro-optical lenses, again, being optically structured such that light beams directed from a point of an object onto the micro-optical lens by a main lens at different angles of incidence are directed onto different light sensor elements of a light sensor arrangement at least partly arranged below said micro-optical lens.

According to another embodiment, a micro-optoelectronic device may have: a wafer section, a multitude of light sensor arrangements being formed in the wafer section on a first side of same, and the wafer section being optically structured, on a side which is opposite the first side of the wafer section, by means of a rear-side etch attack, lithographic structuring or local material changes such that a multitude of micro-optical elements are formed therein, each of the multitude of micro-optical elements, again, being optically structured such that different portions of the light incident on the micro-optical element are directed onto different light sensor elements of a light sensor arrangement at least partly arranged below said micro-optical element.

According to another embodiment, a micro-optoelectronic device for light-field photography may have a wafer section, a multitude of light sensor arrangements being formed in the wafer section on a first side of same, and the wafer section a multitude of micro-optical lenses being applied on a side which is opposite the first side of the wafer section, each of the multitude of micro-optical lenses, again, being optically structured such that light beams directed from a point of an object onto the micro-optical lens by a main lens at different angles of incidence are directed onto different light sensor elements of a light sensor arrangement at least partly arranged below said micro-optical lens.

According to another embodiment, a method of manufacturing a multitude of micro-optoelectronic devices for light-field photography may have the steps of: providing a first wafer having a semiconductor material; providing a second wafer having an optically transparent material; producing a multitude of light sensor arrangements in the semiconductor material of the first wafer for each of the micro-optical devices to be manufactured; applying an additional material to the second wafer and structuring the additional material such that a multitude of micro-optical lenses are formed therein for each of the micro-optoelectronic devices to be manufactured; producing a wafer stack by means of wafer bonding, said wafer stack having the first wafer and the second wafer arranged above same and having the optically structured additional material, each of the micro-optical lenses being arranged and optically structured such that light beams directed from a point of an object onto the micro-optical lens by a main lens at different angles of incidence are directed onto different light sensor elements of a light sensor arrangement at least partly arranged below said micro-optical lens; and dicing the wafer stack into the multitude of micro-optoelectronic devices.

According to another embodiment, a micro-optoelectronic device for light-field photography may have a stack consisting of a first wafer section and a second wafer section arranged above same, the first wafer section having a semiconductor material which includes a multitude of light sensor arrangements formed therein, and each of the multitude of light sensor arrangements having a multitude of light sensor elements, and the second wafer section having an optically transparent material and an additional material arranged on the second wafer section, said additional material being structured such that a multitude of micro-optical lenses are formed therein, each of the multitude of micro-optical lenses, again, being optically structured such that light beams directed from a point of an object onto the micro-optical lens by a main lens at different angles of incidence are directed onto different light sensor elements of a light sensor arrangement at least partly arranged below said micro-optical lens.

According to another embodiment, a method of manufacturing a multitude of micro-optoelectronic devices may have the steps of providing a first wafer having a semiconductor material; providing a second wafer having an optically transparent material; producing a multitude of light sensor arrangements in the semiconductor material of the first wafer for each of the micro-optical devices to be manufactured; structuring the second wafer such that a multitude of micro-optical elements are formed therein for each of the micro-optoelectronic devices to be manufactured; producing a wafer stack by means of wafer bonding, said wafer stack having the first wafer and the second wafer arranged above same, each of the micro-optical elements being arranged and optically structured such that different portions of the light incident on the micro-optical element are directed onto different light sensor elements of a light sensor arrangement at least partly arranged below said micro-optical element; dicing the wafer stack into the multitude of micro-optoelectronic devices; and producing an optically transparent window in the first wafer so that light of a light source located beyond a side of the first wafer which faces away from the second wafer may pass through the first wafer.

According to another embodiment, a micro-optoelectronic device may have a stack consisting of a first wafer section and a second wafer section arranged above same, the first wafer section having a semiconductor material which includes a multitude of light sensor arrangements formed therein, and each of the multitude of light sensor arrangements having a multitude of light sensor elements, and the second wafer section having an optically transparent material and being structured such that a multitude of micro-optical elements are formed therein, each of the multitude of micro-optical elements, again, being optically structured such that different portions of the light incident on the micro-optical element are directed onto different light sensor elements of a light sensor arrangement at least partly arranged below said micro-optical element, said micro-optoelectronic device having an optically transparent window in the first wafer through which light of a light source located beyond a side of the first wafer which faces away from the second wafer may pass through the first wafer section.

Thus, embodiments provide integrated systems which may also be referred to as micro-optoelectronic systems (MOES).

Embodiments of the invention enable low-cost mass production of micro-optoelectronic devices, the possibility of integrating micro-optical elements with almost any optical properties and of laterally and vertically positioning micro-optical elements—in relation to the sensor arrangements and sensor elements associated with them—with precision within ranges of less than 1-2 µm and with very small rotational errors of less than 0.5°. Thus, many components are produced in one adjustment step.

Such embodiments enable low-cost production of micro-optoelectronic devices for applications such as light-field photography, for example, wherein portions of light are directed, depending on their angles of incidence, onto different light sensors elements of the light sensor arrangement arranged below them, or such as spectral analysis wherein portions of light are directed—depending on their wavelength ranges—onto different light sensor elements of the light sensor arrangement arranged below the optical element.

In such methods, the light sensors arrangements may be arranged in the first wafer for front-side illumination or rear-side illumination.

In embodiments wherein the first wafer section is configured for rear-side illumination, the second wafer section will be arranged on a rear side of the first wafer section. In addition to enabling smaller component heights, such embodiments enable an improved filling factor and, thus, further lateral miniaturization and/or improvement of light detection and/or image capture given the same surface area, or lateral extension.

Applications of the embodiments arise in each field of use of, e.g., photography or of image or line scanners, both in the bulk consumer market and in specific niche products. For example, embodiments of the present invention may be employed in the field of light-field capture as integrated micro-optics sensor elements having a broad spectrum of applications, e.g. for scanning surface profiles as a documentation aid in quality analysis or archeology. Using specially equipped microscopes, biology and life science may record their objects three-dimensionally and analyze them in various depths afterwards. Thus, full analysis even of fast cell processes becomes possible. For consumer and professional applications, cameras may be offered with which no focusing is necessary during capturing, and which thus are at an advantage not only in poor lighting conditions, but even on rainy days or in underwater photography since any unwanted small drops or particles may be filtered out directly in front of the optics. Further cases of application for embodiments of the present invention are capture and analysis of images (pictures) outside the visible spectrum, or by means of true-color captures. Environmental technology, medicine and science may thus be provided with new and/or less expensive tools. Machine-based image processing may develop new algorithms due to three-dimensional image information, as it were, and may possibly be implemented at lower cost by dispensing with several cameras.

In said fields of application, embodiments enable highly precise mutual positioning of the elements around less than 1-5 µm in the lateral and 1-10 µm in the vertical directions, so that the imaging of micro-optics on the image sensor is effected at a position which is accurately defined. This is useful in order to be able to offer micro-optical systems comprising connected electronic image processing as a low-cost mass product without having to mechanically or electronically calibrate the imaging position. Knowledge of the precise imaging position is useful particularly when elements of the image sensor are to be correlated with one another, with the real world or with a three-dimensional model of an image. Even when imaging a light spectrum to a series of sensor elements, accuracy of the imaging location is one of the most important possible criteria for associating the imaging with the individual wavelength ranges of the incident light.

BRIEF DESCRIPTION OF THE DRAWINGS

Embodiments of the present invention will be detailed subsequently referring to the appended drawings, in which:

FIG. 1A shows a cross-section of an embodiment of a wafer stack section and/or micro-optical device for rear-side illumination from a first wafer section and a second wafer section arranged above same.

FIGS. 8B-8D show different dimensioning examples of embodiments in accordance with FIG. 1A.

Thus, identical reference numerals are used in the present application for objects and functional units having identical or similar functional properties.

DETAILED DESCRIPTION OF THE INVENTION

Figure 1B:
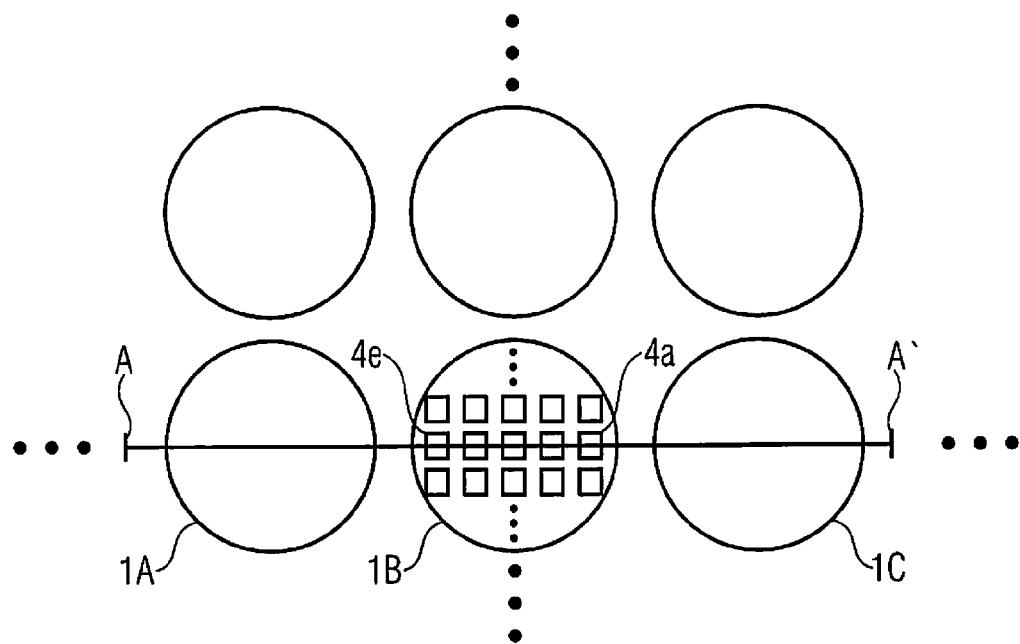
FIG. 1B shows a plan view of a wafer section or even a wafer stack section comprising spherical micro-optical elements.

Light sensor arrangements have a multitude of light sensor elements adjacent, e.g., in the lateral direction (x and/or y direction(s)). Depending on the context, or as apparent from the respective context, individual light sensor arrangements as light sensors are and/or a multitude of light sensor arrangements adjacent, e.g., in the lateral direction are referred to as light sensors or "sensors" for short.

Examples of light sensor elements are so-called pixels. A "pixel" refers to an image point of a generally two-dimensional image or image sensor and/or image sensor element. The term "pixel" is derived from the English term "picture element".

That sensor surface area per pixel which is effectively exposed to light incidence is referred to as the "filling factor" of a pixel on an image sensor. In this context, any light incident outside said area is lost to image capture.

Embodiments of the present invention may comprise most varied types of image sensors and/or light sensor elements, e.g. in CCD (charge coupled devices) technology or in CMOS (complementary metal oxide semiconductor) technology. The CCD light sensors may achieve a higher filling factor since the charges captured (picked up) per exposure are shifted as a sequence to the readout unit, and since, consequently, little space may be used for circuit elements other than the sensors. However, they typically have poorer image properties than CMOS light sensors since, e.g., crosstalk may occur between the points (dots) of a row.

For each individual pixel, CMOS sensors may use several transistors which may amplify and store the charges picked up and may delete any residual charges within the sensor. Some circuit designs provide up to six transistors to achieve optimum capturing quality with regard to image noise and dynamic range.

The light-sensitive part of a light sensor element may be configured, e.g., as a photodiode or phototransistor, wherein any light within the visible and/or invisible wavelength range(s) that may be incident on them is converted to electrical current at a p-n junction, said electrical current being dependent on the light intensity. For example, silicon or germanium may be used as the semiconductor material, but other semiconductor materials, also including organic semiconductor materials, also come into consideration.

The light-sensitive part of a pixel cell or of a light sensor element is arranged within a semiconductor crystal, e.g. silicon crystal; layers consisting of metal and glass which have been structured are deposited over same in several process steps, for example. In designing and manufacturing of the sensors, care is taken to ensure that incidence of light upon the light-sensitive zone within the silicon crystal continues to be possible in that the wirings are configured appropriately so that they extend next to the light-sensitive areas and/or sensor surfaces.

One possibility of achieving further miniaturization of, e.g., silicon-based image sensors consists in thinning the silicon wafers to such an extent that exposure or illumination may be effected from the rear side of the silicon wafer. In this context, that side of the wafer on which the light sensor elements are arranged or formed is referred to as the "front side", and the side opposite said front side is referred to as the "rear side" of the wafer. The penetration depth of the light depends on the wavelength; it is high for red light and very low for blue light. Silicon is transparent to infrared radiation. As a result, a wafer is thinned to have about 20 μm or less to be able to effectively detect a sufficient amount of light on the sensor cells.

The transparency, or light transmission, of a material depends on the wavelength of the light, on the material and/or on properties of the material as well as on the thickness of the material. The transmission factor describes the portion of the incident light or light flux which fully penetrates the material, here the wafer material for example, or which—in the event that a light-sensitive part of a light sensor element is arranged in the semiconductor material—fully penetrates through to the light-sensitive part. In this context, a material, e.g. a substrate material or wafer material, will be referred to as being transparent if the transmission factor is higher than 50%, advantageously higher than 70% and particularly advantageously higher than 90%.

The rear-side exposure results in new degrees of freedom in the wiring of the sensor elements; for example, more transistors may be integrated or better filling factors may be achieved. Embodiments of the present invention may comprise pixel sizes below 1 μm. Due to such sub-micron pixels, a higher resolution may be achieved while maintaining the size of the image sensor, or smaller sensor chips may be achieved while the performance is maintained or improved.

Embodiments of the inventive methods enable low-cost manufacture of systems having such micro-optoelectronic devices at the wafer level, it being possible for the optical structuring of the wafers and/or the production of the light sensor elements within the wafers to be effected at the wafer level. For example, integration of the devices is cheaper since expensive adjustment and/or readjustment as may be used in conventional systems is eliminated. Further embodiments enable high-precision and irreversible joining processes of wafers and the corresponding wafer parts, it being possible to manufacture—in an adjusting step wherein, e.g., the first and second wafers are mutually adjusted—many micro-optoelectronic components in one adjusting step and one joining step. The mutual connection of wafers from different manufacturing technologies, here for example an optically structured glass wafer and a silicon wafer provided with light sensor elements, may also be referred to as "hybrid integration".

In the following, embodiments of manufacturing micro-optoelectronic devices and embodiments of micro-optoelectronic devices will be described wherein the first wafer, or the first wafer section, is generally also referred to as an image sensor wafer, and wherein the second wafer and/or the second wafer section is configured as a glass wafer and is referred to accordingly.

FIG. 1A shows a cross-section of an embodiment of a micro-optoelectronic device 100 comprising a stack consisting of a first wafer section 3 and a second wafer section 2 arranged above same, the first wafer section 3 and the second wafer section 2 having been interconnected by means of a wafer bonding process. The first wafer section 3 has a first layer or generally a first portion 3a of semiconductor material including zones doped therein, e.g. the light-sensitive zones explained above, but also the further transistors that may be used, e.g., for the CMOS sensors, as well as a second layer 3b or generally a second portion 3b comprising the wiring levels made of polysilicon, metals, oxides or nitrides, for example. The wiring levels or wiring structures 5a, 5b of the image sensor wafer 3 are depicted symbolically in FIG. 1A. One may further differentiate between the interconnection levels 5a concealed within the second portion 3b of the image sensor wafer and the externally located contact areas, designated by 5b, as an electrical connection with other components. The wiring structures 5a and 5b are formed from polysilicon or metals, for example, which in turn are electrically insulated from one another in the lateral and vertical directions by means of oxides or nitrides, as is depicted symbolically in FIG. 1A.

The first portion 3a of the image sensor wafer 3 has three light sensor arrangements 4A-4C arranged therein, each of which in turn comprises five light sensor elements 4a, 4b, 4c, 4d, 4e, the reference numerals being drawn in for the central light sensor arrangement only. The light sensor elements 4a-4e may also be referred to as pixel elements. Reference numeral 6 designates a protective layer as a diffusion barrier on the surface of the sensor wafer 3, which cannot be seen in FIG. 1A, however. Reference numeral 7 designates an optional adhesive layer for connecting the glass wafer 2 to the sensor wafer 3, as exists, e.g., in embodiments comprising adhesive bonding. In other wafer-bonding methods, e.g. anodic bonding, the stack comprises no such adhesive layer 7. The adhesive layer 7 may be optically transparent, may be at least partially optically transparent, may be phosphorescent or the like. The glass wafer section 2 is structured such that it has three micro-optical elements 1A to 1C formed therein. The micro-optical elements 1 may be, e.g., radial lenses, elliptical lenses, spherical lenses, or cylindrical lenses, as will be explained in more detail below with reference to FIGS. 1A and 1C, or may be other micro-optical elements having refractive or diffractive properties, for example. Embodiments may additionally comprise a structured, opaque layer 8 to avoid scattered light, said layer 8 being arranged on the surface of the glass wafer 2 between the micro-optical elements 1, for example.

Figure 1C:
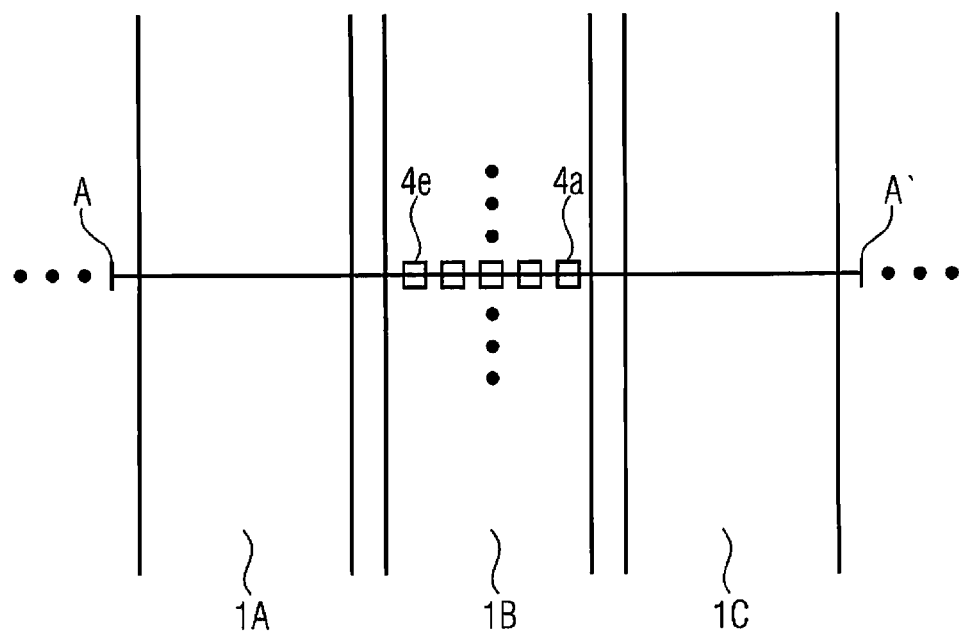
FIG. 1C shows a plan view of a wafer section or even a wafer stack section comprising cylindrical micro-optical elements.

FIG. 1A further shows three symbolic pencils of light 9A, 9B and 9C, which stand for any number of different pencils of light which are incident on different micro-optical elements 1A, 1B and 1C, respectively, each of the micro-optical elements 1A, 1B and 1C being optically structured such that the light beams 9A, 9B and 9C are directed onto the same light sensor element 4b of the light sensor arrangements 4A, 4B and 4C arranged below said micro-optical elements 1A, 1B and 1C, respectively. The same applies to the pencils of light 10A, 10B and 10C which are also incident approximately from one same direction, but—in contrast to pencils of light 9A-9C—are incident on the micro-optical elements 1A-1C from another, or different, direction, and all of which are directed onto the same light sensor element, namely 4c, of the respective light sensor arrangement 4A-4C. In other words, each light sensor arrangement 4A-4C has a micro-optical element 1A-1C associated with it, namely the first light sensor arrangement 4A is associated with the first micro-optical element 1A, the second light sensor arrangement 4B with the second micro-optical element 1B, and the third light sensor arrangement 4C with the third micro-optical element 1C. In FIG. 1B, the respectively associated micro-optical element is arranged directly above the respective light sensor arrangement. Depending on the application, the diameters and/or the widths of the micro-optical elements 1A-1C may be larger or smaller than the lateral extension of the associated light sensor arrangement 4A-4C and may be arranged directly above it or may be only partly arranged above it. Also, it is possible for the light sensor elements to be regularly arranged above the entire light sensor, as is the case in conventional image sensors.

The micro-optical elements 1A-1C are structured such that pencils of light falling on the micro-optical elements 1A-1C from different directions are directed onto different light sensor elements 4a-4e of the light sensor arrangements 4A-4C arranged below them and associated with them. Or, in other words, the micro-optical elements 1A-1C are arranged above the light sensor arrangements 4A-4C associated with them and are optically structured such that a pencil of light coming from a first direction 9A-9C is directed onto a first light sensor element 4b of the respective light sensor arrangements 4A-4C, and a pencil of light coming from a second direction 10A-10C, which differs from the first direction, is directed onto a second light sensor element 4c—which differs from the first light sensor element—of the respective light sensor arrangements 4A-4C. The angles of incidence are not related to the spherical surfaces of the lens-like micro-optical elements 1A-1C, but rather to a surface plane 21 which is independent of the respective spatial structuring of the micro-optical elements and extends in parallel with the lateral extensions of the wafers 2 and 3.

The accuracy of the resolution or, in other words, the size of the ranges of angles of incidence of light 9A and 10A, which are thus distinguishable per light sensor arrangement 4A, depends on the number of light sensor elements of the light sensor arrangement and on the optical properties of the micro-optical elements 1A, the optical properties of a micro-optical spherical lens 1A as is depicted in FIG. 1A depending on the diameter and the thickness of the lens, the curvature of the lens, and the thickness of the glass wafer 2.

An embodiment in accordance with FIG. 1A may therefore also be referred to as an ultra-thin image sensor wafer 3 bonded with a micro-optics wafer 2.

FIG. 1B shows a plan view of an embodiment in accordance with FIG. 1A, the cross-section A-A' in FIG. 1B corresponding to the cross-section depicted in FIG. 1A. FIG. 1B shows an embodiment comprising spherical lenses as the micro-optical elements 1A to 1C. With regard to the micro-optical element 1B, the light sensor elements 4a-4e of FIG. 1A are additionally depicted, only light sensor elements 4a and 4e being provided with reference numerals. As may be seen from FIG. 1B, embodiments may comprise light sensor arrangements 4A-4C which do not only have a number of light sensor elements 4a-4e, but also have several parallel rows or random arrangements of light sensor elements. In addition, embodiments of the wafer stack portions 100 may comprise a micro-optical element or any number of micro-optical elements and light sensor arrangements associated with same, rather than having the three micro-optical elements and the light sensor arrangements 4A-4C associated with same, as is depicted in cross-section in FIG. 1A. The wafer stack sections may comprise only one single row of micro-optical elements and light sensor arrangements associated with same, or may comprise several rows having the same number or different numbers of micro-optical elements and light sensor arrangements associated with same.

FIG. 1C shows a plan view of an embodiment of a wafer stack section having cylindrical lenses as the micro-optical elements 1A-1C, the cross-section A-A' in FIG. 1C again corresponding to the cross-section, shown in FIG. 1A, of the wafer stack section. Embodiments of the wafer stack portion may comprise any number of cylindrical lenses or other micro-optical elements 1A-1C and light sensor arrangements 4A-4C associated with same, and the respective light sensor arrangements 4A-4C may comprise, rather than the five light sensor elements arranged in a row, any number of light sensor elements in one row, in several rows or in other arrangements.

Micro-optical elements may exist, e.g., in grid-like arrangements of lenses or other micro-optical elements which split up the projection beam of a camera system into individual pencils of light which, in turn, generate local images on the image sensor. One application is so-called light-field photography or integral photography. Said light-field or integral photography enables extracting the entire image from subimages in various ways. For example, within limits set by the imaging performance of the camera system, the depth information of the scenario captured may be evaluated, or a change in perspective in terms of a change in the angle of view may be effected.

In addition to or instead of comprising lenses and prisms as refractive micro-optical elements 1A-1C, embodiments may also comprise, as micro-optical elements 1A-1C, such arrangements of diffractive optics which spatially modulate the incident light by means of diffraction effects, for example in order to spectrally decompose light beams onto individual sensor elements. In addition, the arrangements of the micro-optical elements need not necessarily have the forms of grids, in particular regular grids, but may also be concentrically grouped around a center, for example, form a distorted grid, be delimited to one row only, or be distributed only across subareas of the image sensor. A randomly selected distribution is also possible. In addition, the term "lenses" is to be understood in the broader sense of optics, i.e. refractive properties of the micro-optical elements may be achieved by the curvatures of surfaces as is shown in FIG. 1A, as well as by gradual changes in the refractive index in the lens material and/or in the glass wafer 2 or generally in the second wafer section 2.

As regards manufacturing of the wafer stacks and wafer stack portions, two basic embodiments of the sequence of processes may be distinguished, which will be briefly explained below.

In the first basic embodiment, the sensor wafer 3 exists as a fully functionalized wafer and is bonded to the second wafer 2. The glass wafer 2 may already be optically structured, in other words comprise the micro-optical elements, or be still unstructured, i.e. exist only in the form of the substrate intended for it, here a glass substrate. The term "fully functionalized" or "fully processed" wafer 3 here is used to refer to the image sensor wafer 3, for example, which already comprises the semiconductor structures, created in the semiconductor material 3*a*, of the light sensor elements 4*a*-4*e*. Here, methods involving high temperatures are ruled out so as not to destroy the semiconductor structures and metallization planes that have already been created, so that such embodiments employ wafer-bonding processes which avoid high temperatures, i.e. adhesive bonding, for example. Accordingly, this applies to partly functionalized or partly processed wafers wherein the semiconductor structures have been produced at least partly, or wherein other temperature-sensitive structures have been produced.

In other words, in such embodiments of the manufacturing method wherein the image sensor wafer 3 is fully structured prior to bonding, e.g. as in FIG. 1A with the corresponding light sensor arrangements 4A-4C and the corresponding light sensor elements as well as the conductor structures 5*a* and 5*b*, structuring of the glass wafer 2 may also have been completed prior to bonding, i.e. the glass wafer 2 may have the micro-optical elements 1*a*-1*c*, for example, or still be unstructured or only partly structured prior to bonding, in which case optical structuring of the glass wafer 2 is effected following wafer bonding.

In alternative embodiments wherein essentially infrared light is measured and, thus, infrared optics is employed, as will be described in more detail by means of FIG. 6A, for example, or in embodiments comprising diffractive optics, the material of the sensor wafer 2 may also be reshaped (profiled) into optical elements, or may be structured accordingly.

In the second basic embodiment connection, or bonding, of the micro-optics wafer 2, or of its precursor, e.g. a borosilicate glass wafer, to the silicon crystal of the sensor wafer 3 is effected prior to its actual manufacture, so that anodic bonding or silicon direct bonding may be employed. In specific embodiments, shaping of the micro-optical elements 1A-1C, e.g. of microlenses 1A-1C of small heights or concave lenses, may also be effected in this step already. In particular, in such embodiments, the micro-optics wafer 2 may serve as a support for the sensor wafer 3 so as to grind same down to a very small thickness. Such processes are known for manufacturing the so-called "SOI wafers" (SOI=silicon on insulator).

In accordance with an embodiment of this second basic embodiment, both the first wafer made of semiconductor material and the second wafer made of transparent material are unprocessed or unstructured and may be connected by anodic bonding. In a further embodiment of the second basic embodiment, only the first wafer made of the semiconductor material is unprocessed, whereas the wafer made of the transparent material is already partly or fully optically structured. In this case, too, anodic bonding may be applied as long as the optical structures in the transparent wafer are not damaged, as is the case with glass, for example, in contrast to many plastics.

Figure 1D:
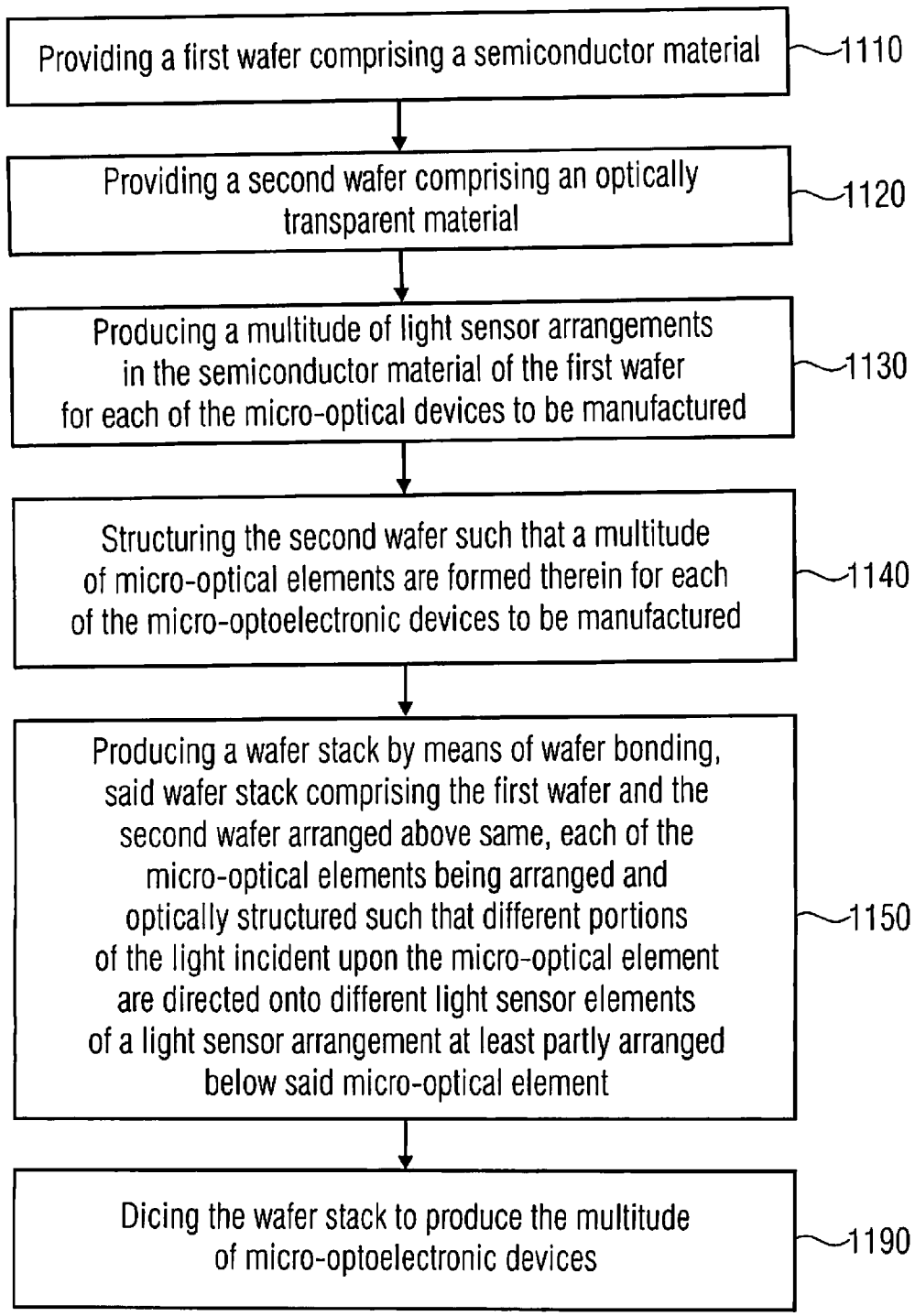
FIG. 1D shows a method of manufacturing a wafer stack comprising a multitude of micro-optical devices in accordance with FIG. 1A.

FIG. 1D shows a flowchart of an embodiment of a method of manufacturing a wafer stack comprising a multitude of micro-optoelectronic devices, comprising the following steps.

Providing 1110 a first wafer comprising a semiconductor material, and providing 1120 a second wafer comprising an optically transparent material.

Producing 1130 a multitude of light sensor arrangements in the semiconductor material 3*a* of the first wafer for each of the micro-optical devices to be manufactured.

Structuring 1140 the second wafer such that a multitude of micro-optical elements 1A-1C are formed therein for each of the micro-optoelectronic devices 100 to be manufactured.

Producing 1150 a wafer stack by means of wafer bonding, said wafer stack comprising the first wafer and the second wafer arranged above same, each of the micro-optical elements 1*a*-1*c* being arranged and optically structured such that different portions of the light incident on the micro-optical element are directed onto different light sensor elements 4*a*-4*e* of a light sensor arrangement 4*a*-4*c* at least partly arranged below said micro-optical element.

Dicing 1190 the wafer stack to produce the multitude of micro-optoelectronic devices 100.

The providing steps 1110 and 1120 may be performed simultaneously or in a different order. In addition, the step of producing 1130 a multitude of light sensor arrangements may be performed prior to or following production 1150 of the wafer stack, depending on the type of wafer bonding and the type of structuring of the second wafer, and step 1140 of structuring the second wafer may be performed prior to or following the step of producing 1150 the wafer stack, depending on the type of wafer bonding. The same applies to the other embodiments as well.

The step 1130 of producing the multitude of light sensor arrangements 4*a*-4*e* includes, e.g., doping the semiconductor material accordingly so as to produce the transistor structures, or, put generally, production of the first portion 3*a* of the image sensor wafer 3. Moreover, step 1130 may also include producing the second portion 3*b* of the image sensor wafer 3 comprising the wiring levels made of polysilicon and/or metals as well as the insulating areas made of oxides and/or nitrides.

The optically transparent material used is advantageously glass, however other transparent materials such as plastics, for example, may also be used for the second wafer 2.

In addition, production of micro-optics at the wafer level is advantageously implemented using glass wafers 2, wherein the glass is adapted to the semiconductor material, e.g. silicon, in terms of the thermal expansion coefficients. Examples of such glasses or wafer materials are borosilicate glasses or alkali-free glass wafers.

Various methods may be employed for the step 1140 of structuring the second wafer. Firstly, for example, a micro-optical lens arrangement may be etched from a glass surface, secondly a micro-optical lens arrangement may be effected by means of reshaping by means of viscous molding. This involves the glass flowing at a correspondingly high temperature and adopting the desired shape. Micro-optics produced by means of reshaping have the advantage over etched optics that they typically may be manufactured at lower cost and are also suitable for shaping glasses adapted thermal expansion.

Other methods that may be employed in step 1140 for structuring the second wafer are gray-tone lithography and laser ablation. Gray-tone lithography means that a height profile is introduced into a resist layer and transferred by means of anisotropic dry etching into the surface to be structured.

In addition, diffraction patterns may be produced in step 1140, for example by means of mask lithography, electron-beam writing, ion-beam writing, laser exposure, laser ablation and/or abrasive methods.

In further embodiments, local changes in material properties are created, in step 1140, by means of high-energy laser radiation within the second wafer, e.g. a glass wafer, and/or the first wafer, e.g. a silicon wafer, which also form micro-optical elements based on diffractive and/or refractive effects.

The step 1150 of wafer bonding, which is also referred to as "wafer stacking" as meaning "stacking of wafers" by bonding methods, may include as joining processes any kind of material-to-material connection, such as adhesion or soldering, but may also exploit effects such as solid-state diffusion between extremely well-polished surfaces, as is the case with anodic bonding and direct bonding, for example. Apparatuses for positioning and joining wafers are referred to as wafer bonders. In embodiments of the manufacturing process, wafer bonders are employed which initially mutually adjust the wafers or wafer discs to be connected, generally silicon or glass, and subsequently connect them to one another under the application of a vacuum, of pressure and of heat, depending on the type of wafer bonding. Due to optical methods, the level of adjustment accuracy is very high, i.e. around approximately 1 μm. However, following the adjustment, the upper wafer is dropped onto the lower wafer in that its holding points are detached at the same time, so that minor further shifts may possibly result from this. However, even when taking into account said further shifts, effective tolerances that are better than 1-2 μm may be achieved in well-controlled serial processes. In addition, since said tolerances are set at the wafer edge, the rotational error is extremely small.

Bonding of wafers by means of adhesives may be applied, for example, to produce extremely thin wafers. Prior to thinning, they are temporarily bonded onto another wafer, a so-called carrier wafer, which only serves for handling purposes and will be removed later on. Said temporary bonding is a possibility of producing thin wafers for rear-side exposure, which wafers otherwise would be too unstable for handling due to their small thickness alone. In embodiments comprising a stack consisting of a sensor wafer 3 and a second transparent wafer 2, the second transparent wafer, see FIG. 1A, and/or an additional wafer 13, see FIG. 3A, may be mechanically structured such that, e.g. by means of a sufficient thickness thereof, very thin sensor wafers 3 may be used for rear-side exposure without requiring such temporary carriers. The transparent second wafer 2 and/or the additional wafer 13 may thus also have a mechanical function in terms of stabilization in addition to their optical function.

Figure 1E:
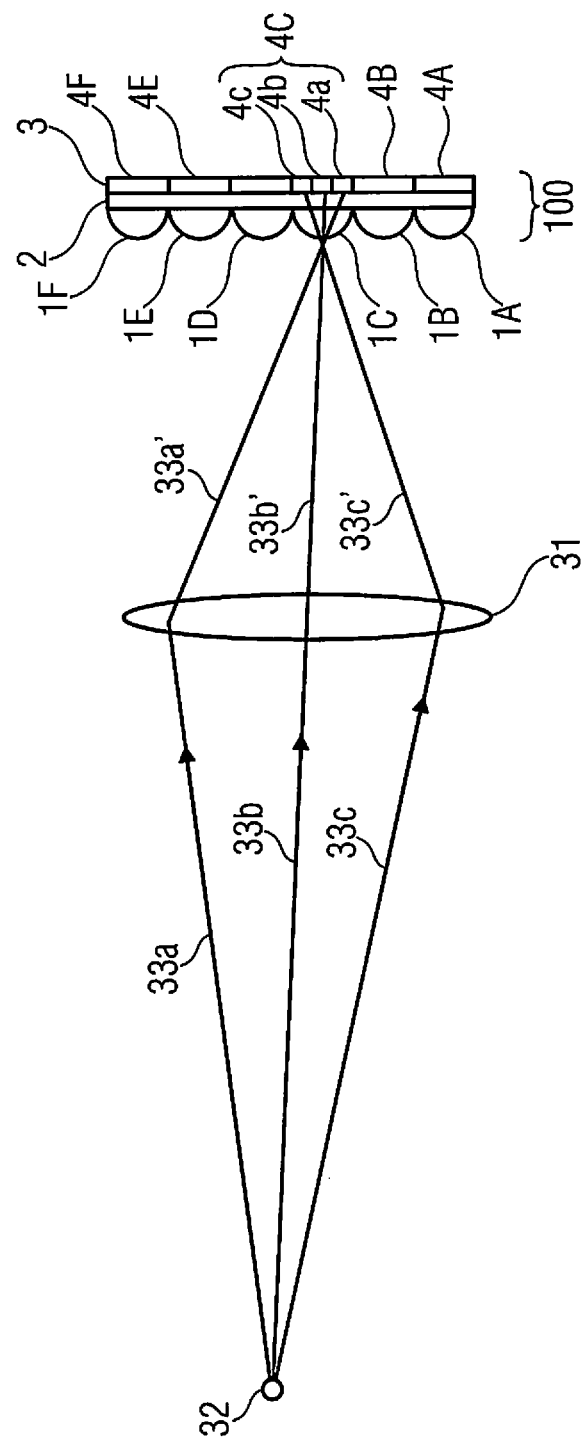
FIG. 1E shows a schematic representation of light-field photography.

In the following, an embodiment of light-field photography will be described with reference to FIG. 1E. FIG. 1E shows a schematic representation of an embodiment of light-field photography comprising a main lens 31 and a micro-optoelectronic device 100 which, again similarly to FIG. 1A, shows an optically structured glass wafer 2 having micro-optical lens structures 1A-1F as well as the light sensor arrangements 4A-4F associated with same. So that the representation is easy to understand, details have been omitted, similarly to FIG. 1A, and also only three light sensor elements 4a-4c were drawn in, in FIG. 1E, for the light sensor arrangement 4C. What is additionally drawn into FIG. 1E are a point (dot) 32 of an object as well as three exemplary optical paths 33a-33c which—starting from the object 32—fall on the main lens 31, are refracted there and fall on the micro-optical element 1C as refracted beams 33a'-33c', respectively, and are refracted again there and fall on the light sensor elements 4a-4c. In the process, the beams 33a'-33c' form examples of the pencils of light 9C and 10C of FIG. 1A, which from various directions impinge upon the micro-optical lens 1C where they are directed onto various light sensor elements in dependence on their directions of incidence and/or angles of incidence.

In general terms, the light beams are directed from the point 32 of an object by the main lens 31 onto a point of the focal plane of the micro-optoelectronic device 100. In contrast to normal photography, wherein no micro-lens field 1A-1F is arranged behind the main lens, and wherein only the overall light intensity of the light beams 33a'-33c' is captured, the light beams 33a'-33c' are refracted by the additional micro-optical lens 1C, so that it is not only the intensity that is detected, but the partial intensities are detected in dependence on their angles of incidence. Said additional information may be processed, for example, for producing three-dimensional pictures.

Figure 2A:
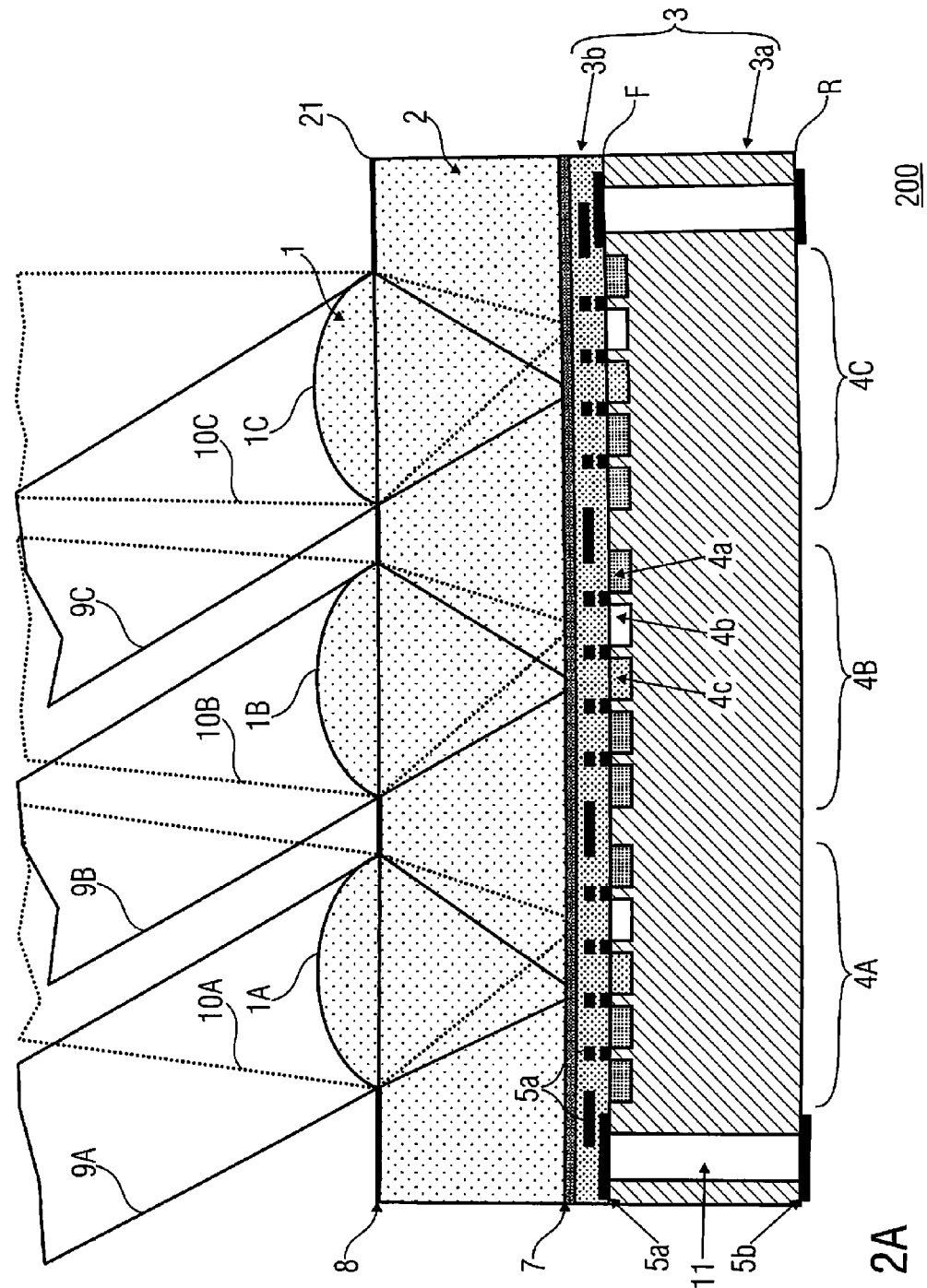
FIG. 2A shows an embodiment of a wafer stack section or micro-optical device consisting of a first wafer section and a wafer section arranged above same, the light sensor arrangement and the light sensor elements in the first wafer section being configured for front-side illumination.

FIG. 2A shows another embodiment of a wafer stack section 200 which is similar to that of FIG. 1A, but differs from same in that the image sensor wafer 3 has been configured for front-side exposure. In other words, the light sensor arrangements 4A-4C are arranged on the front side F of the image sensor wafer 3 or the semiconductor material portion 3a, and the wiring level portion 3b comprising the concealed wiring levels 5a and the external contact areas 5b is arranged above same. As can be seen from FIG. 2A, the concealed, or internal, connection levels 5a are not arranged behind the light sensor elements 4a-4c in terms of the incidence of light, but are arranged laterally thereof, as described above. The connecting levels 5a are electrically connected via electrical feedthroughs 11 in the image sensor wafer 3a to the contact areas 5b so as to connect same to external circuits. Additionally, such feedthroughs 11 may also be formed in the micro-optics wafer 2, in which case an opening will have to be kept or formed in the adhesion layer 7. To avoid the via holes 11, which are complex in terms of the technical process involved, it is also possible to open a window for the contacts on the sensor wafer 3. In the micro-optics wafer 2, this may be effected, for example, by specific sawing processing or by large-area etching.

As becomes apparent when directly comparing FIGS. 1A and 2A, the wafer stack piece 200 is thicker than that of FIG. 1A.

The manufacturing process for such micro-optical devices 200 is similar to the process of FIG. 1D and differs from same essentially in that the light sensor elements 4a-4c are created on the front side F of the semiconductor portion 3a, the connecting structure portion 3b is formed on the front side F of the semiconductor material portion 3a, and the glass wafer 2 and the image sensor wafer 3 are formed on that surface of the wiring portion 3b that faces away from, or is arranged opposite, the semiconductor material portion 3a.

On account of the increased thickness of the semiconductor material portion 3a and, thus, of the image sensor wafer 3, the image sensor wafer 3 may exhibit sufficient stability, so that in such embodiments very thin glass wafers 2 may be employed.

Figure 3A:
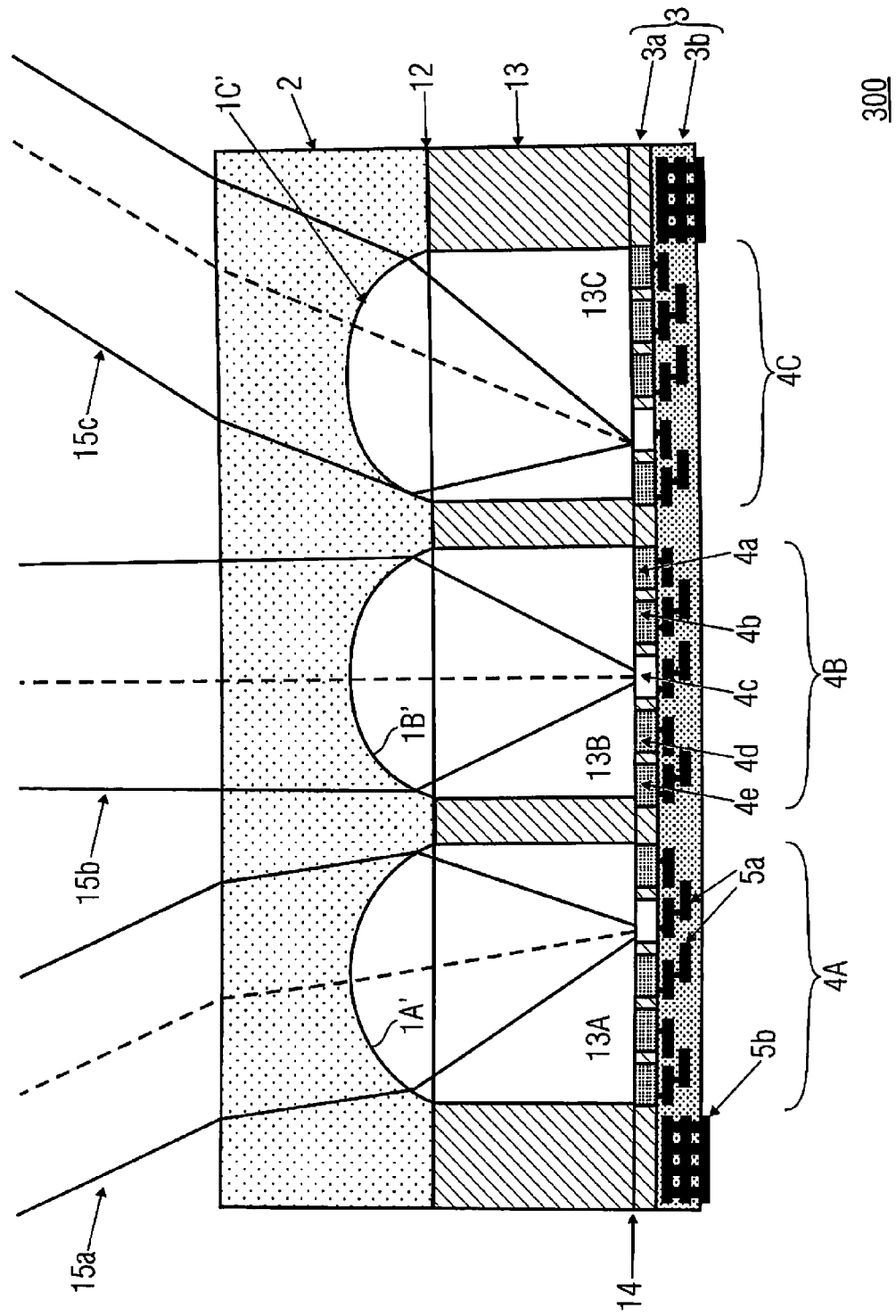
FIG. 3A shows a cross-section of an embodiment of a wafer stack section or micro-optical device consisting of a first wafer section, a second wafer section arranged above same, and a further wafer section disposed between them and comprising cavities.

FIG. 3A shows a cross-section of a further embodiment of a wafer stack section 300 comprising an image sensor wafer 3 for rear-side exposure, as is described in FIG. 1A, said wafer stack section 300 comprising—in contrast to the embodiment 100 in FIG. 1A—no lens structures 1A to 1C on the surface associated with the incidence of light 15a-15c, however, but having concave micro-optical elements 1A'-1C' on the side associated with the image sensor wafer 3. A further wafer or wafer section 13 having cavities 13A-13C, which may also be referred to as through-openings, is arranged between the image sensor wafer 3 and the glass wafer 2. In the additional wafer piece 13, the cavities 13A-13C are arranged above the corresponding light sensor arrangements 4A-4C, so that light is refracted by the concave micro-optical structures 1A'-1C' and impinges on the light sensor arrangements 4A-4C through the cavities 13A-13C.

FIG. 3A shows three pencils of light 15a-15c which impinge upon the glass wafer section 2 from different directions, respectively, by analogy with the beams 9A-9C and the light beams 10A-10C of FIG. 1A; for clarity's sake, however, only three individual beams coming from respectively different directions are drawn in here. As was already described in FIG. 1A, the light beam 15a, which impinges upon the glass wafer section 2 from a first direction, is refracted and concentrated by the first concave micro-optical structure 1A' such that it falls on the light sensor element 4b of the light sensor arrangement 4A. The second pencil of light 15b, which falls on the glass wafer section from a second direction different from the first direction, is refracted and concentrated by the concave micro-optical structure 1B' such that it falls on the light sensor element 4c of the light sensor arrangement 4B. The third pencil of light 15c falls on the glass wafer section 2 from a third direction different from the first two directions and is refracted and concentrated there by the concave micro-optical structure 1C' such that it falls on the light sensor element 4d of the light sensor arrangement 4C.

The cavities 13A-13C may be filled with liquids or gases, however advantageously with gases, e.g. air, due to the lower refractive index. Alternatively, there may also be a vacuum within the cavities 13A-13C.

Reference numeral 12 designates the joining zone between the micro-optics wafer 2 or glass wafer section 2 and the additional wafer section 13, which is a silicon wafer 13, for example. Utilization of wafers 3 or 3a and 13, which comprise the same or similar materials, simplifies bonding and manufacture in general. However, the additional wafer 13 may also comprise other semiconductor materials or other non-transparent materials. Wafer sections 13 made of non-transparent materials have the advantage that any disturbances caused by scattered light, which are reduced in FIG. 1A by the additional opaque layer 8, may be kept small in this embodiment, too. Reference numeral 14 designates the joining zone between the image sensor wafer 3, which may also be a silicon wafer 3, for example, and the additional wafer section 13. The joining zone 14 may also comprise an oxide layer.

Embodiments 300 may be manufactured using the technology of viscous molding of micro-lenses. This involves, e.g., providing a silicon wafer 13 with cavities 13A-13C, e.g. by means of an anisotropic ion-supported etching process, an anisotropic wet-etching process or an anisotropic wet-etching process. The glass wafer 2 is anodically bonded onto the silicon 13, and the cavities 13A-13C are closed off by a further silicon wafer 3, e.g. by anodic or direct bonding. Shaping of the concave lens structures 1A'-1C' will then take place due to the high temperature and the pressure difference between the cavities and the surroundings.

The wafer stack consisting of the three wafers 3, 13 and 2 is subsequently processed such that it may be used as a starting material for creating the functional structures of the image sensor wafer 3, for example thinning to a manageable wafer thickness, and polishing to achieve the desired surface quality.

Figure 3B:
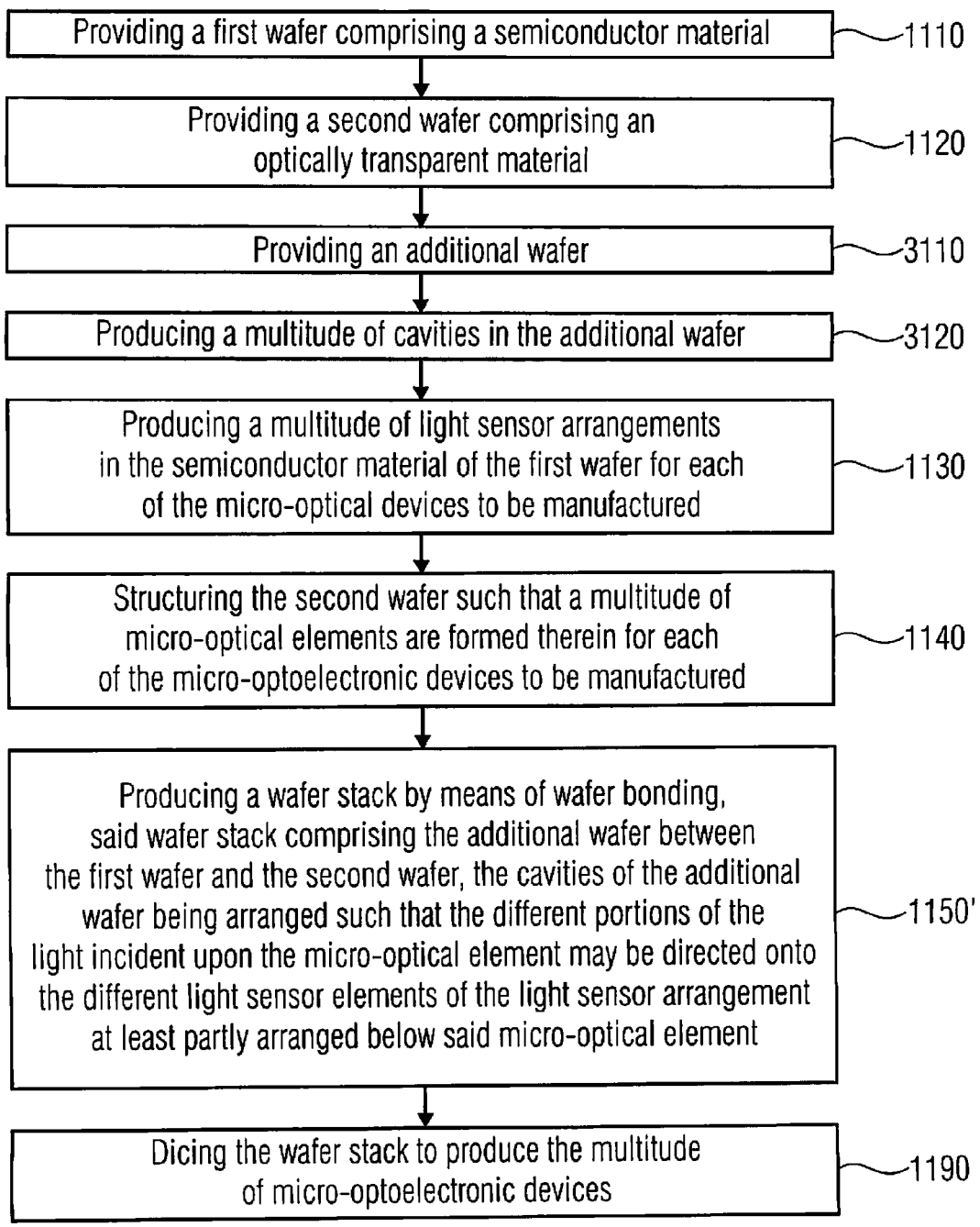
FIG. 3B shows a method of manufacturing a wafer stack in accordance with FIG. 3A.

FIG. 3B shows a flowchart of an embodiment of a method of manufacturing a wafer stack comprising a multitude of micro-optoelectronic devices, said method comprising the following additional steps as compared to that of FIG. 1D.

Providing 3110 an additional wafer, e.g. made of a semiconductor material, advantageously of the same material as the substrate 3a. In addition, the material is advantageously opaque, or non-transparent.

Producing 3120 a multitude of cavities 13A-13C in the additional wafer.

Producing 1150' a wafer stack by means of wafer bonding, said wafer stack comprising the additional wafer 13 between the first wafer 3 and the second wafer 2, said cavities 13A-13C of the additional wafer 13 being disposed such that the different portions 15a-15c of the light incident on the micro-optical element 1A'-1C' may be directed onto the different light sensor elements 4a-4e of the light sensor arrangement 4A-4C at least partly arranged below said micro-optical element.

The step of producing 1130 the multitude of light sensor arrangements may be effected prior to or following the step of producing 3120 the cavities, depending on the type of production of the cavities.

An embodiment in accordance with FIG. 3A may also be referred to as a micro-optics wafer 2, 13 having cavities 13A-13C on an image sensor wafer 3 which has joining zones 12 and 14 and was bonded prior to the CMOS process for producing the functional structures of the image sensor wafer 3.

Figure 4A:
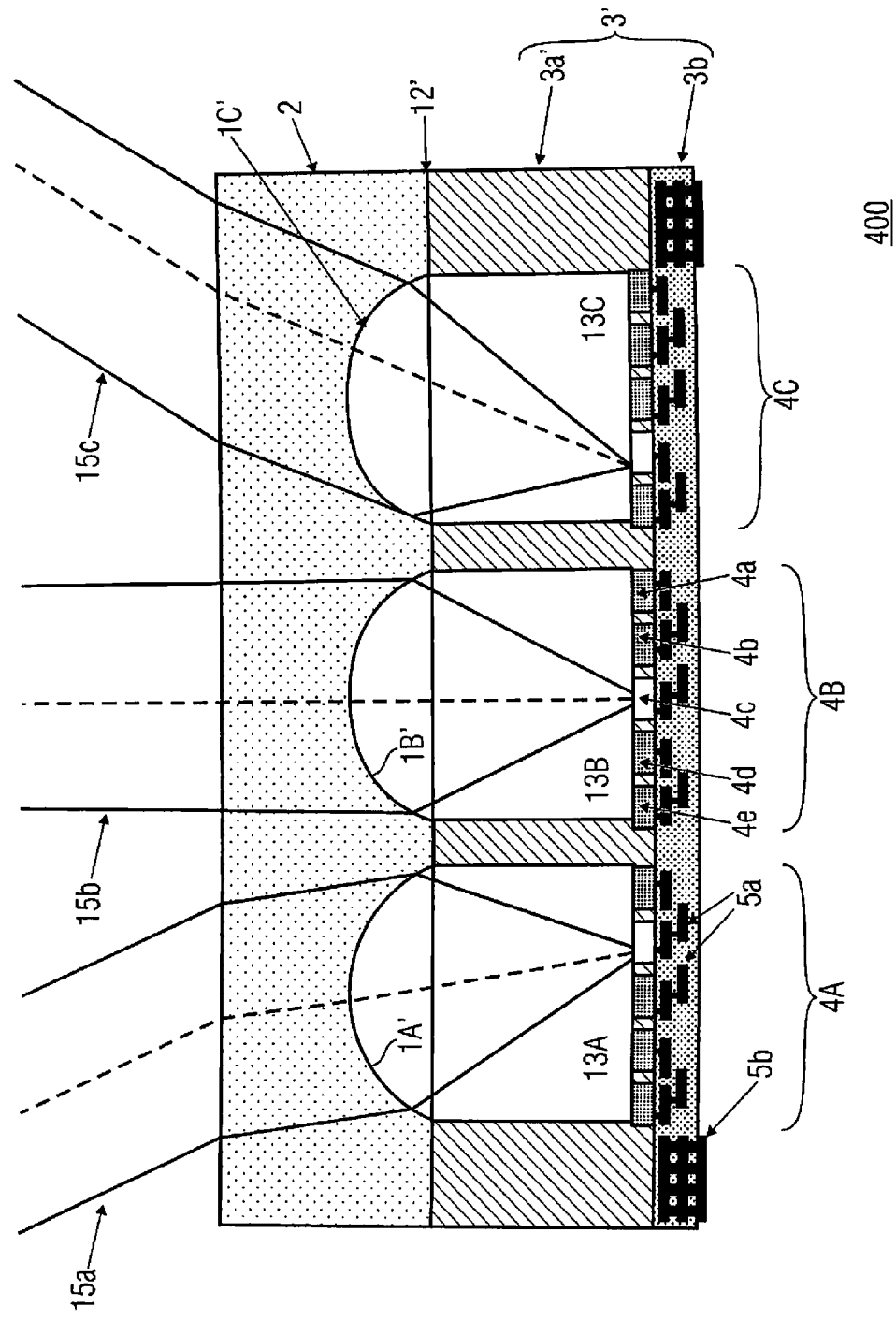
FIG. 4A shows a cross-section of an embodiment of a wafer stack section or micro-optical device consisting of a first wafer section and a second wafer section arranged above same, the first wafer section comprising cavities above the light sensor arrangements.

FIG. 4A shows a further embodiment 400 of a wafer stack section which is very similar to that of FIG. 3A but wherein the cavities 13A-13C were etched directly into the substrate of the sensor wafer 3 or, to be more precise, into the substrate of the semiconductor portion 3a (which may also be referred to as the substrate portion 3a), in contrast to the wafer stack section of FIG. 3A. To emphasize this structural difference as compared to FIG. 3A, the semiconductor material portion 3a is designated here by 3a', the image sensor wafer is designated by 3', and the joining zone between the image sensor wafer 3' and the glass wafer 2 is designated by 12' (silicon wafer 3' with cavities worked into it, 12': joining zone between the silicon wafer 3' and the glass wafer 2, may also contain an oxide layer; pencil of rays 15a-15c with an auxiliary focal line, see dashed line).

Production of such embodiments entails very homogeneous control of the etching depth. In embodiments of the manufacturing process, production of the cavities 13A-13C may be effected prior to or following processing of the image sensor wafer 3'. If it is effected prior to said processing, the lenses 1A'-1C' may also be shaped before said processing. If it is effected following said processing, a glass wafer 2 structured with lenses 1A'-1C' will be placed upon said cavities, for example, since the viscous flowing of the lenses does not start until above the admissible temperatures for functional semiconductor devices. There may be different boundary conditions for diffractive optics elements.

Embodiments in accordance with FIG. 4 may also be referred to—for short—as a micro-optics wafer 2 having cavities 13A-13C as an integral constituent of the image sensor wafer 3', the bonding having been performed prior to the CMOS process.

Figure 4B:
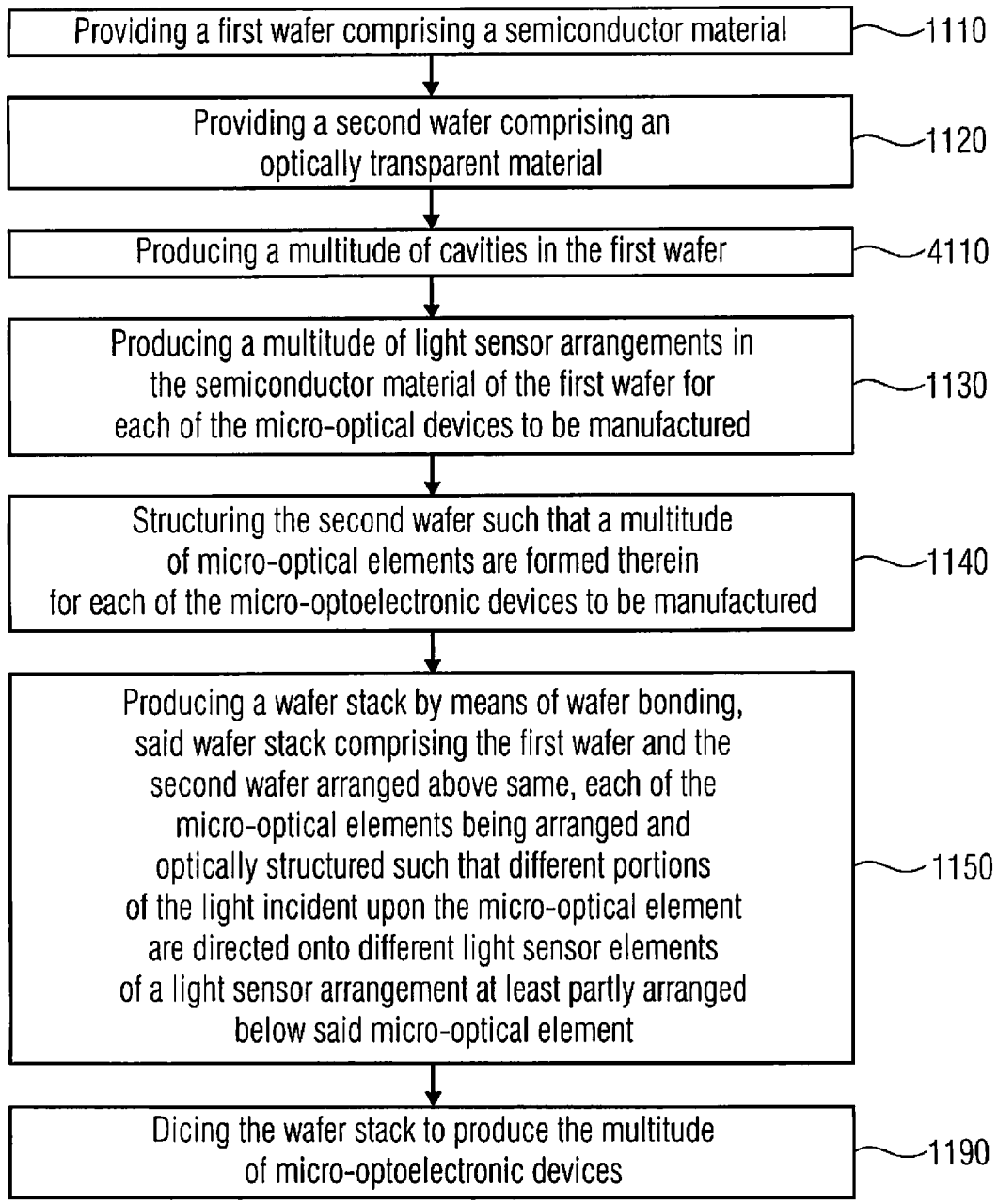
FIG. 4B shows a flowchart of an embodiment of a method of manufacturing a wafer stack section in accordance with FIG. 4A.

FIG. 4B shows a flowchart of an embodiment of a method of manufacturing a wafer stack comprising a multitude of micro-optoelectronic devices, which comprises the following steps as compared to that of FIG. 1D.

Producing 4110 a multitude of cavities 13A-13C in the first wafer and on the rear side thereof, said cavities 13A-13C of the first wafer 1 being disposed such that the different portions 15a-15c of the light incident on the micro-optical element 1A'-1C' may be directed onto the different light sensor elements 4a-4e of the light sensor arrangement 4A-4C at least partly arranged below said micro-optical element.

The step of producing 1130 the multitude of light sensor arrangements may be effected prior to or following the step of producing 4110 the cavities and/or prior to or following wafer bonding, depending on the type of production of the cavities and the type of wafer bonding of the wafers 2, 3, 13.

Figure 5A:
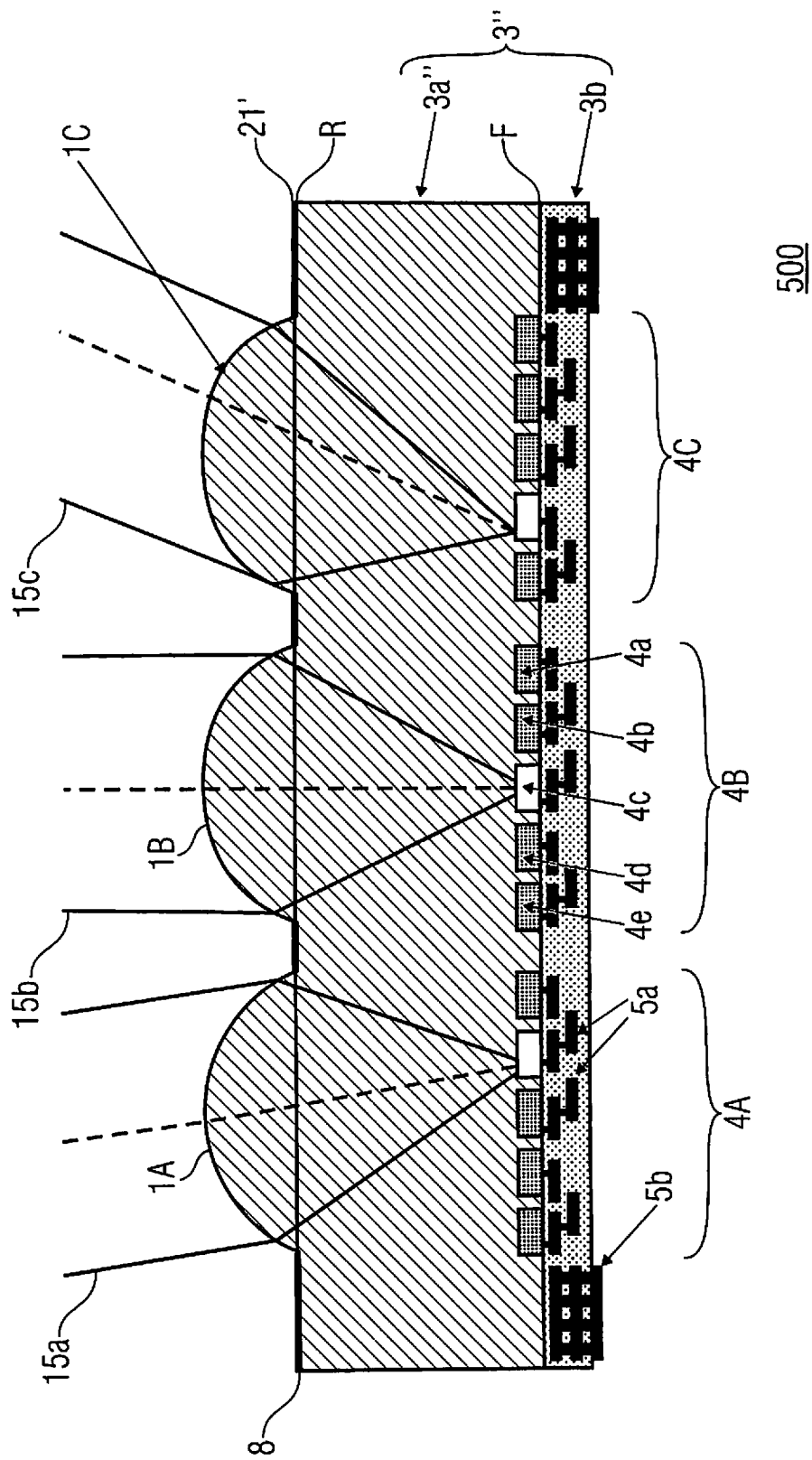
FIG. 5A shows a cross-section of an embodiment of a wafer section and/or micro-optical device, the light sensor arrangements being arranged on a first side for rear-side illumination, and the wafer being optically structured on the opposite side.

FIG. 5A shows a further embodiment 500 of a wafer section wherein the sensor wafer 3", more specifically the semiconductor portion 3a", forms the basic material from which the micro-optics structures 1A-1C are formed, e.g. by a rear-side etch attack, a lithographically produced structure or local material changes such as doping, diffusion or oxidation. In other words, the image sensor wafer 3" itself is optically structured. Therefore, embodiments 500 may also be referred to as micro-optoelectronic devices or wafer sections for short, wherein the micro-optics 1A-1C is an integral constituent of the sensor wafer 3". Here, the first layer 3a" is a silicon substrate, for example, which is transparent in the infrared range. Thus, the semiconductor material itself may be used for refractive optics or may serve as a substrate for optics elements. From that point of view, it is sufficient, with such embodiments that are to be operated in infrared light, for only their rear sides R to be optically structured. In addition, for reasons of stability, the wafers may have corresponding thicknesses without this adversely affecting the transparency of the wafer 3" within the light wavelength range used.

By analogy with FIG. 1A, a structured opaque layer 8 for avoiding infrared scattered light is applied to the rear side R of the image sensor wafer 3". Please refer to what was said above in terms of the incident pencils of light 15a-15c falling on the surface 21' of the rear side of the image sensor wafer 3" from different directions, the refraction and focusing by means of the convex micro-optical structures 1A-1C, and the focusing to different sensor elements 4a-4e as a function of the respective direction of incidence of light.

Some of the technologies employed for detecting infrared light are not related to CMOS technology, and they are known as MEMS bolometers (MEMS=micro-electromechanical systems), for example. Therefore, the way of representing the pixels 4a-4e and the wiring level 5a is to be understood to have only symbolic meaning in this context.

Figure 5B:
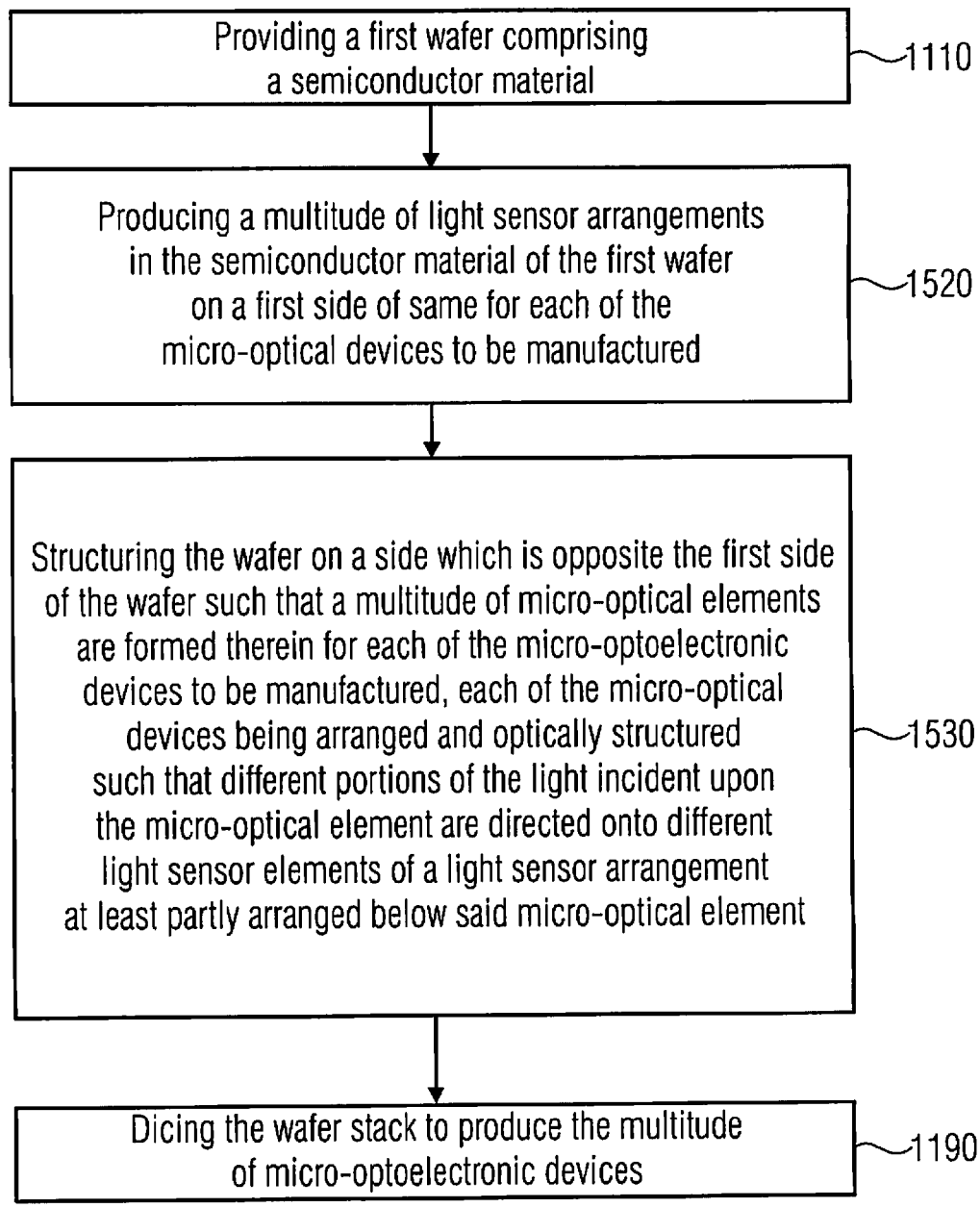
FIG. 5B shows a flowchart of an embodiment of manufacturing a wafer section in accordance with FIG. 5A.

FIG. 5B shows a flowchart of a method of manufacturing a wafer comprising a multitude of micro-optoelectronic devices, comprising the following steps.

Providing 1110 a wafer comprising a semiconductor material.

Producing 1520 a multitude of light sensor arrangements 4A-4C in the semiconductor material 3a" of the wafer 3" on a first side (front side) F of same for each of the micro-optical devices to be manufactured.

Structuring 1530 the wafer 3" on a side (rear side) R which is opposite the first side of the wafer such that a multitude of micro-optical elements 1a-1c are formed therein for each of the micro-optoelectronic devices to be manufactured, each of the micro-optical devices 1A-1C being arranged and optically structured such that different portions of the light incident on the micro-optical element are directed onto different light sensor elements 4a-4e of a light sensor arrangement 4A-4C at least partly arranged below said micro-optical elements.

In alternative embodiments, the step of structuring 1530 the wafer may also be performed, for example, prior to the step of producing 1520 the multitude of light sensor arrangements.

Figure 6A:
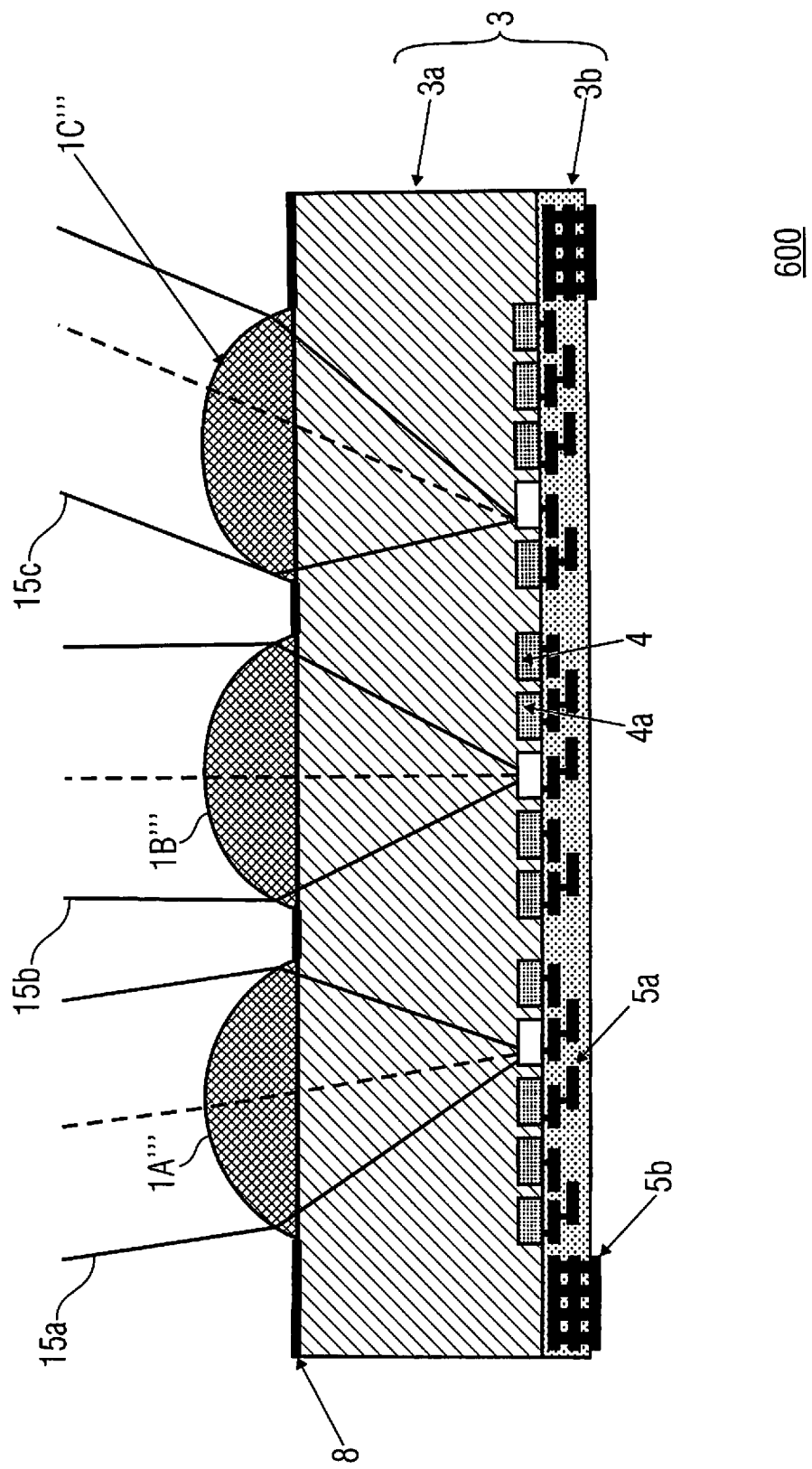
FIG. 6A shows a cross-section of an embodiment of a wafer section and/or micro-optical device comprising light sensor arrangements arranged on the front side for rear-side illumination, and micro-optical elements additively applied on the opposite side.

FIG. 6A shows a cross-section of an embodiment 600 which is similar to that of FIG. 5A, but wherein the micro-optical elements 1A'''-1C''' are not formed, or structured, from the image sensor wafer 3 or the semiconductor portion 3a itself, but have been additively applied to the image sensor wafer 3. Said additive refractive micro-optics structures 1A'''-1C''' may be created, for example, on the basis of polymers or glass pastes. Such embodiments 600 may therefore also be briefly referred to as wafer sections and/or micro-optoelectronic devices comprising a micro-optics that has been additively applied to a substrate to be bonded or to a functional sensor wafer. Generally, such additive structures are also applicable to the other embodiments. The additive material may be discretely applied over the respective light sensor arrangements 4A-4C or be deposited as a layer or in its entirety and be structured by means of ablating or reshaping methods. For example, the lenses 1A'''-1C''' may also be shaped by means of viscous flowing from individual depots applied on the image sensor wafer.

Stamping and embossing of structures may also be used for producing the micro-optical structures 1A'''-1C'''. The micro-lenses 1A'''-1C''' or other micro-optical structures 1A'''-1C''' may, in other words, be produced by stamping techniques, gray-tone lithography, laser ablation or by means of a layer-by-layer build-up. However, most of said processes will then be based on utilization of plastics. In further embodiments the lenses 1A'''-1C''' are melted—by means of the surface tension of viscous materials—from individual depots of plastic or glass paste. In further embodiments, self-organizing processes are applied wherein spheres, for example, position themselves on a surface and form the basis for further process steps for forming the micro-optical elements 1A'''-1C''' or, generally, the lens matrix. However, the embodiments in accordance with FIGS. 1A to 5A exhibit improved optical properties, in particular the embodiments in accordance with FIGS. 1A to 4A, because of the separate optical wafer, and here, in particular, for the utilization of glass wafers since the latter have better long-term optical properties than plastics or other materials.

Figure 6B:
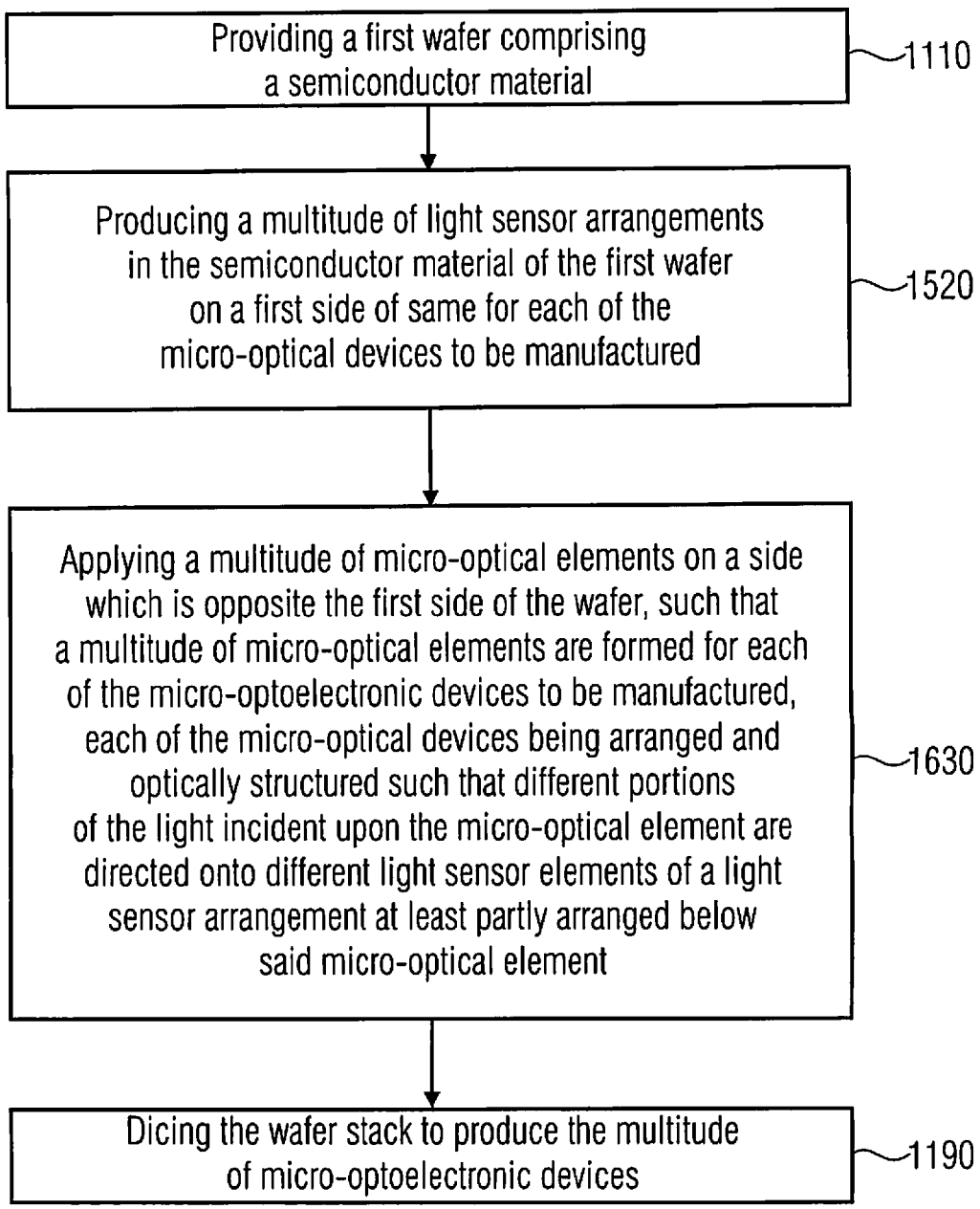
FIG. 6B shows a flowchart of an embodiment of a method of manufacturing a wafer section in accordance with FIG. 6A.

FIG. 6B shows a flowchart of a method of manufacturing a wafer comprising a multitude of micro-optoelectronic devices, which is similar to that of FIG. 5B. However, in contrast to the method in FIG. 5B, the method in accordance with FIG. 6B does not comprise optically structuring the glass wafer itself, but applying an additional optically transparent material to the glass wafer by means of material application, and optically structuring said additional material to produce the micro-optical elements. In other words, instead of step 1530, the method in accordance with FIG. 6B comprises the following step 1630: applying 1630 a multitude of micro-optical elements 1A'''-1C''' on a side R opposing the first side F of the wafer, such that a multitude of micro-optical elements are formed for each of the micro-optoelectronic devices 600 to be produced, each of the micro-optical devices 1A'''-1C''' being arranged and optically structured such that different portions of the light incident on the micro-optical element are directed onto different light sensor elements 4a-4e of a light sensor arrangement 4A-4C at least partly arranged below said micro-optical element.

Further embodiments may comprise both optical structuring of the glass wafer itself (see FIGS. 1A and 1D; 2A; 3A and 3B; 4A and 4B; 5A and 5B) and structuring of an additional material, e.g. resist, etc., additionally applied to the glass wafer (see FIGS. 6A and 6B).

Figure 7A:
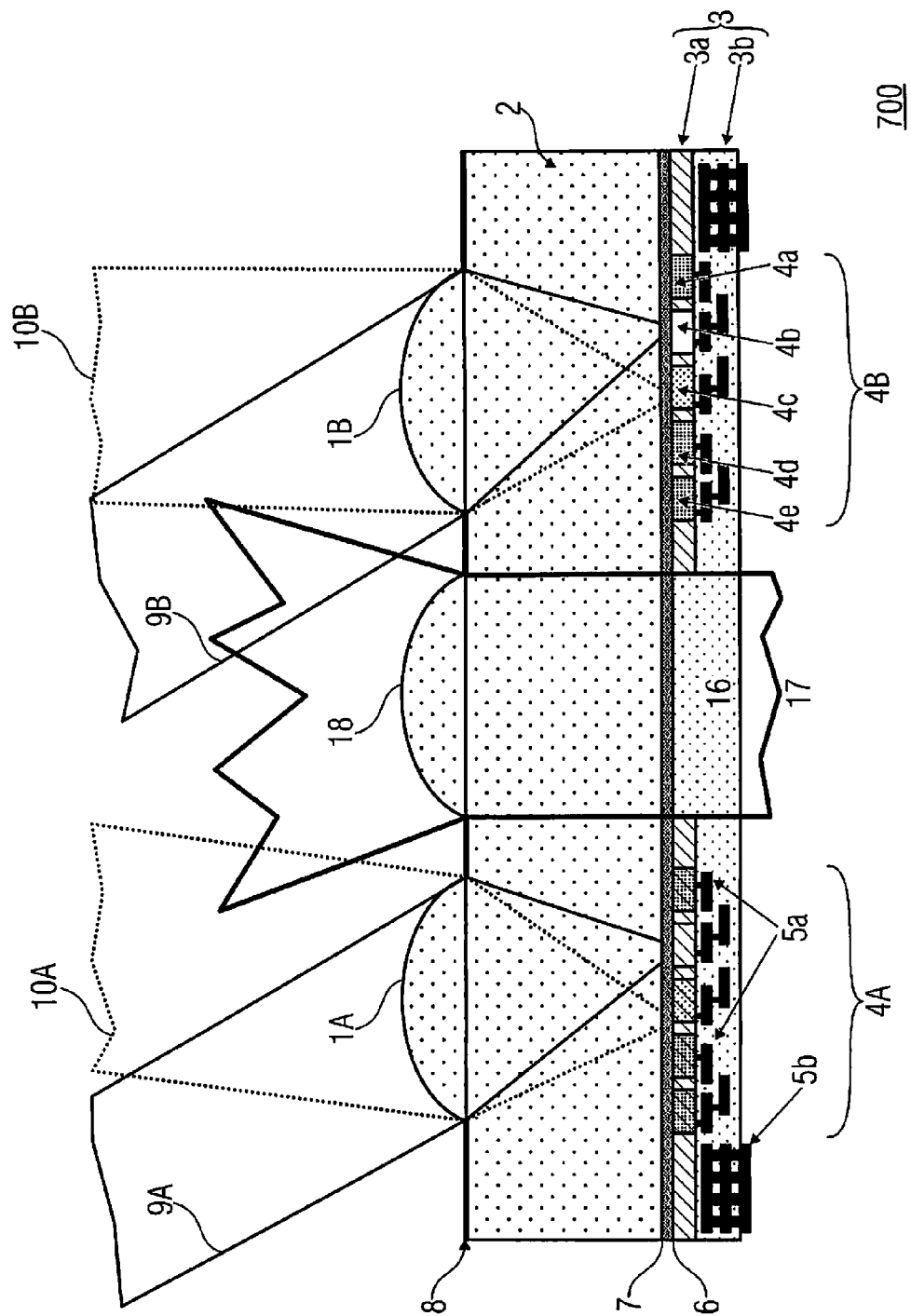
FIG. 7A shows a variation of an embodiment in accordance with FIG. 1A comprising a translucent window in the first wafer section.

FIG. 7A shows a cross-section of a variation of the embodiment 700 in accordance with FIG. 1A, which differs from the embodiment 100 in accordance with FIG. 1A in that the image sensor wafer 3 comprises one or more optically transparent windows 16, by means of which the light 17 of a light source located behind the sensor wafer 3 may pass. In other words, the light beam 10 enters the image sensor wafer 3 through the window 16, and passes through the micro-optics wafer 2, and may additionally be refracted by an optional micro-optical element 18, for example in the form of a lens, as is depicted in FIG. 7A. Depending on the specific application, any refractive or diffractive or other optics may be employed by analogy with the micro-optical structures 1A and 1B. In other words, FIG. 7A thus shows a micro-optics/sensor wafer combination 700 comprising a transparent window in the sensor wafer 3.

Embodiments in accordance with FIG. 7A form a new possibility of enabling—independently of the type of the bonding process—a window or an accumulation of windows within the sensor wafer 3 for integrating light sources in the optical path of the micro-optics wafer. Such integrations of light sources may be used for various purposes; for example, a modulated light source may serve, in addition to illuminating objects, to measure object distances, for example by means of transit-time differences of light. Local projection of the light source may serve as a reference point for multi-camera applications, for example. Emission of light signals from various locations of the sensor wafer may selectively illuminate objects located within the visual field. Also, the sensor wafer may, as a priority, be designed such that it has more light outlets than sensor elements, and that it rather serves to control the illumination effect in the scenario illuminated. Further embodiments also include active wafers having light emitters and light sensors distributed thereon in place of the sensor wafer.

Accordingly, this window concept is also applicable to all of the other embodiments.

Embodiments of the micro-optoelectronic devices exhibit micro-optical structures whose diameters, e.g. in spherical or circular structures, or whose widths, e.g. in cylindrical or elongate structures, are smaller than 500 μm and larger than 5 μm, advantageously smaller than 250 μm and larger than 10 μm.

Alternative embodiments provide a method of manufacturing a wafer or a wafer stack comprising a multitude of micro-optoelectronic devices in the form of wafer sections or wafer stack sections, the previously described methods differing from the latter essentially only by the additional step of dicing the wafer or wafer stack so as to produce the discrete micro-optical devices.

Utilization of wafer technologies results in the advantage of a high level of precision of installation both in the lateral and in the vertical directions, i.e. perpendicular to the wafer surface. A high surface quality is achieved by sophisticated grinding and polishing methods, and many methods of coating and structuring are possible which may provide the component with additional qualities. Moreover, they may be employed to connect further elements electrically or only for mechanical purposes, e.g. by means of soldering. Thus, the embodiments listed provide a basis for manifold further layouts which is in line with the existing trend toward optics integration and miniaturization in camera technology.

Mounting optically unstructured glass wafers in the optical light entrance area of image sensors is a further possibility of hybrid integration, for example by means of adhesive bonding, e.g. to enable handling of ultra-thin image sensors. However, such components are contacted from the circuit side so that a wafer mounted on the front side will be removed after thinning. Since the wafer here has no imaging function, no particular positioning accuracy is involved in this kind of application.

Light-field photography or "integral photography" has been known for quite some time and has been met with increasing interest on the part of experts in the field of digital image processing, in particular at the Stanford University, USA, since the 1990s. The quality of light-field pictures highly depends on the sensor resolution, so that the current limitations may be strongly expanded by rear-side exposure. To this end, precise adjustment processes will continue to be decisive for optics integration, since positionings that are accurate to the micrometer is difficult to achieve with fine-mechanical means. Against the background of the current situation set forth above, the previously described methods of wafer-based micro-optics integration assume key positions to enable new applications of micro-optics having medium- to long-term market perspectives as low-cost and yet optically high-quality products.

In the following, an exemplary calculation of a lens wafer for a light-field sensor as a micro-optical component will be described. Initially, calculation of the radius of curvature in accordance with the lens equation will be addressed. Here we shall assume a spherical lens geometry arranged as a lens calotte 1A on the top face of the glass wafer 2, as is shown in FIG. 1A, for example. The sensor-side focus of the lens 1A in this calculation example is located on the rear side R' of the glass wafer, i.e. directly at the boundary to the image sensor or semiconductor material 3a. Thus, incident parallel beams will ideally be imaged as dots on the image sensor 4A with its light sensor elements 4a-4e.

In the following calculations, which will be explained with regard to the example of FIG. 1A, a lens 1A made of borosilicate glass shall be assumed which has air (refractive index $n_{air}=1$) as the overlying medium. Examples of silicate glasses for wafer bonding with silicon, which may have a thickness of typically 100 μm to 1.1 mm, for example, are: Borofloat® glass (brand name by Schott) $n_d=1.47140$ at 587.6 nm; Pyrex® (brand name by Corning Inc.) $n_d=1.474$ at 588 nm; and Schott "AF32" alumino-borosilicate glass (AF stands for alkali-free). In this context, the parameter n without an index will also be used in the following for the refractive index $n_d$ of the glass wafer 2.

In addition, it shall be assumed for the calculations that the focal point of the system is located within the glass wafer 2, and no aberrations that are typical for lenses will be taken into account.

The focal width f is calculated as the distance from the apex of the lens calotte 1A in accordance with $$f = \frac{n \cdot R}{n-1}$$

(see Bergmann-Schäfer "Lehrbuch der Experimentalphysik") with f as the focal width of the lens, n as the refractive index of the glass wafer material (n=1.47) and R as the radius of curvature of the lens surface. If the equation is solved for the radius of curvature, one will obtain:

$$R = \frac{f \cdot (n-1)}{n}. \qquad \text{[Formula 1]}$$

Figure 8A:
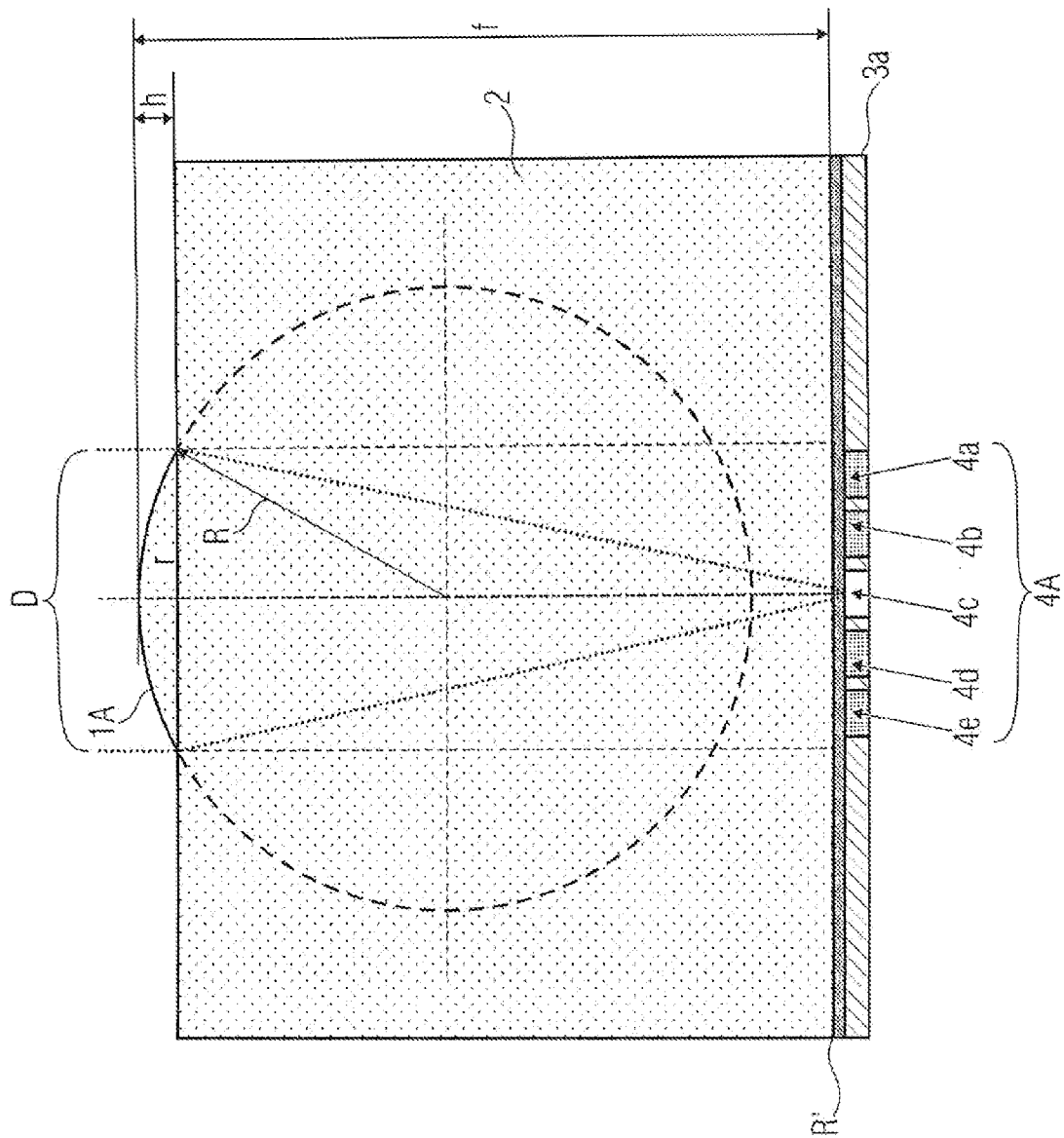
FIG. 8A shows an embodiment of a light sensor arrangement having a micro-optical lens, arranged above same, in accordance with FIG. 1A to illustrate the dimensionings.

FIG. 8A shows the parameters by means of the example of the light sensor arrangement 4A comprising the light sensor elements 4a-4e in accordance with FIG. 1A. As is apparent from FIG. 8A, the calotte 1A forms the micro-optical element arranged above the light sensor arrangement 4A.

Calculation of the lens diameter D as an entrance pupil will be explained in more detail below. According to Ren N G, Marc Levoy, Mathieu Brédif, Gene Duval, Mark Horowitz, Pat Harahan: "Light-Field Photography with a Hand-Held Plenoptic Camera", Standford Tech Report CTSR 2005-02, optimum use of the image sensor surface for light-field photography will take place without any overlap of the subimages if the entrance pupil of each micro-lens 1A is tuned to the camera optics. In photography it is common to regulate the opening of the light entrance of a camera objective by means of an aperture (diaphragm). The relationship between the aperture ratio number (f-number), the diameter D of the entrance pupil 1A and the focal width f is as follows:

$$D = \frac{f}{BZ} \text{ or with the radius } r \text{ of the lens calotte} \quad \text{[Formula 2]}$$

$$r = \frac{f}{2 \cdot BZ}.$$

In the following, the geometric relationship between the lens calotte and the wafer thickness will be addressed. Given the radius of curvature R determined above and the lens radius r, the height of the lens calotte may be determined using the Pythagorean theorem:

$$R^2 = r^2 + (R-h)^2 \text{ and/or}$$

$$h = R - \sqrt{R^2 - r^2} \quad \text{[Formula 3]}.$$

Insertion of the formulae developed above results in the following equation:

$$h = \frac{f(n-1)}{n} - \sqrt{\left(\frac{f(n-1)}{n}\right)^2 - \left(\frac{f}{2 \cdot BZ}\right)^2}.$$

If this expression is simplified, it will become apparent that, given the same optical boundary conditions, the lens height h may be scaled proportionally to the wafer thickness in a purely geometric consideration:

$$\frac{h}{f} = \frac{(n-1)}{n} - \sqrt{\left(\frac{n-1}{n}\right)^2 - \left(\frac{1}{2 \cdot BZ}\right)^2}. \quad \text{[Formula 4]}$$

As an example, a system in accordance with FIG. 1A comprising a borosilicate wafer 2 and having a focal number BZ=4 shall be contemplated. The focal width f here corresponds to the wafer thickness including the lens calotte 1A. To this end, the geometry variables r and h are developed generally, i.e. in relation to the wafer thickness. The relative lens radius is obtained from Formula 2:

$$\frac{r}{f} = \frac{1}{2 \cdot BZ} = 12.5\%.$$

The relative lens height is obtained from Formula 4:

$$\frac{h}{f} = \frac{n-1}{n} \sqrt{\left(\frac{n-1}{n}\right)^2 - \left(\frac{1}{2 \cdot BZ}\right)^2}$$

$$= \frac{1.47-1}{1.47} - \sqrt{\left(\frac{1.47-1}{1.47}\right)^2 - \left(\frac{1}{2 \cdot 4}\right)^2}$$

$$= 2.54\%.$$

In accordance with Formula 1, the relative radius of curvature R/f may be determined as follows:

$$\frac{R}{f} = \frac{n-1}{n} = 31.97\%.$$

For a wafer of a thickness of 600 µm, the geometry thus is as follows: lens height h=15.27 µm, lens radius r=75 µm, and radius of curvature R=192 µm. For example, this configuration allows—given an assumed width of 5 µm of an individual light sensor element 4a-4e—arranging, in one row, a maximum number of 15 light sensor elements below the micro-lens 1A.

If the light sensor elements are only 1 µm in size, however, up to 75 sensor cells per row may be arranged below the micro-lens 1A. This significantly improves the quality of the depth resolution of the light-field picture, it being possible for an improvement of the optical imaging performance, e.g. by means of an aspheric lens shape, to become useful.

The tables 8B-8D show further numerical examples calculated in accordance with the above-indicated scheme. The length specifications are indicated in µm. FIG. 8B shows a table wherein the focal width of the lens 1A has been varied, specifically from 30 µm to 600 µm. FIG. 8C shows a table wherein the aperture ratio number BZ has been varied, specifically between the value 2.8 and 32. FIG. 8D shows a table wherein the glass wafer materials and, thus, the refractive index n have been varied, specifically from 1.45 to 1.80.

The dimensioning of the embodiments in accordance with FIGS. 1A to 7A will be addressed below.

In embodiments in accordance with FIG. 1A, the glass wafer 2 fulfils, e.g., a stability-increasing function since the sensor wafer 3 is very thin. The thickness of the glass wafer thus ranges from 100 to 1,000 µm, for example, but advantageously from 200 µm to 600 µm, and particularly advantageously from 300 µm to 400 µm. Thus, the lens radii are advantageously between 13 µm and 107 µm, but particularly advantageously between 19 µm and 71 µm. A corresponding number of light sensor elements having dimensions, in at least one direction, of 0.5 µm to 10 µm, but advantageously from 0.8 µm to 5 µm, particularly advantageously from 0.8 µm to 2 µm, are located below each lens 1A to 1C. In the particularly advantageous version, this results between 9 and 88 light sensor elements in a row per arrangement.

In embodiments in accordance with FIG. 2A, the glass wafer 2 need not exert any stabilizing effect since the sensor wafer 3 is sufficiently thick. It is therefore limited only by its own manageability. Such embodiments may have a thickness of from 30 µm to 1,000 µm, for example, advantageously, however, between 50 µm and 500 µm, particularly advantageously between 100 µm and 300 µm. The latter case results in lens radii of between 6 µm and 54 µm.

In embodiments in accordance with FIG. 3A, the calculations indicated by way of example are not directly applicable since the optical arrangement is different, i.e. concave. However, from a technological point of view, it is useful for the thickness of the entire wafer stack to range from 200 µm to 1000 µm, the intermediate wafer 13 advantageously being selected to be thicker than the glass wafer 2. For example, the glass wafer 2 advantageously has at least a thickness of 50 µm, which may also be achieved by subsequent grinding and polishing of the wafer stack.

The indications provided for embodiments in accordance with FIG. 3A shall also apply analogously to embodiments in accordance with FIG. 4A.

For embodiments in accordance with FIG. 5A care is to be taken to ensure that the refraction behavior of infrared light differs from that of visible light. In addition, silicon has a high refractive index, e.g. 3.4 at a wavelength of 10 μm. Depending on the spectral design of the light sensor cells, this is to be taken into account in the calculation of such embodiments. However, the above-mentioned data of FIG. 1A may be used as reference values for the lens radii since silicon is considered to be transparent at a wavelength of 1.2 μm already. In this context, the values of the glass wafer are to be functionally transferred to the silicon wafer.

The illustrations set forth concerning the embodiments in accordance with FIG. 5A shall analogously apply to embodiments in accordance with FIG. 6A, and the illustrations set forth concerning embodiments in accordance with FIG. 1A shall analogously apply to embodiments in accordance with FIG. 7A.

In the field of applications, light-field photography is only one of the possible examples of innovative products and techniques. It is also feasible, for example, to build "color-fast" cameras or line scanners which resort to wavelength-dependent refraction of light by prisms or diffraction gratings rather than to organic filter layers. The spectrum is then distributed to several light sensors without color filters, so that each light sensor arrangement represents a spectrometer, as it were.

As was set forth, embodiments offer advantages in the context of the above-described endeavor to produce sub-micrometer pixels and rear-side illumination. The alternative of single-chip positioning is possible; however, the position tolerances will then be subject to heavy scattering.

In the consumer field, the imaging performance of affordable objectives with today's resolutions has been exhausted. Embodiments of the present invention, however, also enable relatively cheap and small high-performance cameras by means of small high-resolution sensor chips. Such miniaturized and/or low-cost camera systems may also be applied industrially, in the automotive field or in safety engineering, where they may be employed for machine-based image processing.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of manufacturing a multitude of micro-optoelectronic devices, comprising:
    providing a first wafer comprising a semiconductor material;
    providing a second wafer comprising an optically transparent material;
    producing a multitude of light sensor arrangements in the semiconductor material of the first wafer for each of the micro-optical devices to be manufactured;
    structuring the second wafer such that a multitude of micro-optical elements are formed therein for each of the micro-optoelectronic devices to be manufactured;
    producing a wafer stack by means of wafer bonding, said wafer stack comprising the first wafer and the second wafer arranged above same, each of the micro-optical elements being arranged and optically structured such that different portions of light beams incident onto the micro-optical element are directed onto different light sensor elements of a light sensor arrangement at least partly arranged below said micro-optical element; and
    dicing the wafer stack into the multitude of micro-optoelectronic devices so that each micro-optoelectronic device comprises a single one-piece portion of the wafer stack, the single one-piece portion comprising a multitude of micro-optical elements, arranged in a two-dimensional array, and a multitude of light sensor arrangements with each micro-optical element having a light sensor arrangement at least partially arranged below the respective micro-optical element, each light sensor arrangement comprising a plurality of light sensor elements, arranged in a further two-dimensional array, and each micro-optical element being configured to direct different portions of light beams incident onto the respective micro-optical element onto different ones of the plurality of light sensor elements of the light sensor arrangement at least partly arranged below the respective micro-optical element; and
    producing an optically transparent window in the first wafer so that light of a light source located beyond a side of the first wafer which faces away from the second wafer may pass through the first wafer.

2. The method as claimed in claim 1, wherein wafer bonding is anodic wafer bonding or silicon direct bonding, and producing of the multitude of light sensor arrangements is effected following producing of the wafer stack.

3. The method as claimed in claim 1, wherein wafer bonding is wafer bonding by means of all-over adhesion, and producing of the multitude of light sensor arrangements is effected prior to producing of the wafer stack.

4. The method as claimed in claim 1, wherein structuring of the second wafer is performed by means of etching.

5. The method as claimed in claim 1, wherein structuring of the second wafer is effected by viscous molding and is effected prior to producing of the wafer stack by means of wafer bonding.

6. The method as claimed in claim 1, wherein the optically transparent material is a glass adapted to the semiconductor material of the first wafer in terms of the thermal expansion coefficient.

7. The method as claimed in claim 1, wherein
    the method is for manufacturing a multitude of micro-optoelectronic devices for light-field photography,
    the micro-optical elements are micro-optical lenses, and
    the producing the wafer stack is performed such that light beams directed from a point of an object onto the micro-optical lens by a main lens at different angles of incidence are directed onto different light sensor elements of a light sensor arrangement at least partly arranged below said micro-optical lens.

8. The method as claimed in claim 7, additionally comprising:
    providing an additional wafer;
    producing a multitude of cavities in the additional wafer; and
    producing a wafer stack by means of wafer bonding, said wafer stack comprising the additional wafer between the first wafer and the second wafer, said cavities of the additional wafer being disposed such that the different portions of the light incident on the micro-optical lens may be directed onto the different light sensor elements of the light sensor arrangement at least partly arranged below said micro-optical lens.

9. The method as claimed in claim 3, wherein wafer bonding takes place on a rear side of the first wafer, whereas production of the multitude of light sensor arrangements takes place in the semiconductor material of the first wafer on the front side of same.

10. The method as claimed in claim 7, additionally comprising:
producing a multitude of cavities in the first wafer, said cavities of the first wafer being disposed such that the different portions of the light incident on the micro-optical lens may be directed onto the different light sensor elements of the light sensor arrangement at least partly arranged below said micro-optical lens.

11. The method as claimed in claim 1, wherein the method further comprises producing a plurality of light-field photography devices including building, per light-field photography device, one of the single one-piece portions of the wafer stack into the respective light-field photography device.

12. The method as claimed in claim 1, wherein the method further comprises shipping the one-piece portions of the wafer stacks for respectively being built into light-field photography devices.

13. The method as claimed in claim 1, wherein the producing the optically transparent window in the first wafer is performed so that the light of the light source located beyond a side of the first wafer which faces away from the second wafer may enter the optically transparent window in the first wafer, pass through the first wafer and then pass through one of the micro-optical elements formed in the second wafer so as to be refracted by the one micro-optical element.

* * * * *